United States Patent [19]

Hoenniger, III et al.

[11] Patent Number: 4,885,538

[45] Date of Patent: Dec. 5, 1989

[54] LOW DATA RATE LOW NOISE SERIAL DIGITAL COMMUNICATION LINK FOR MAGNETIC RESONANCE IMAGING SYSTEMS

[75] Inventors: John C. Hoenniger, III, Oakland; Kenneth E. Hosier, Jr., Pittsburgh, both of Calif.

[73] Assignee: The Regents of the University of California, Berkeley, Calif.

[21] Appl. No.: 291,956

[22] Filed: Dec. 29, 1988

Related U.S. Application Data

[63] Continuation-in-part of Ser. No. 235,362, Aug. 19, 1988, abandoned.

[51] Int. Cl.[4] ............................................. G01R 33/20
[52] U.S. Cl. ...................................... 324/312; 324/309
[58] Field of Search ............... 324/300, 304, 307, 309, 324/312, 313, 316; 364/413.13, 498, 574, 575, 965, 965.4

[56] References Cited

U.S. PATENT DOCUMENTS

| | | | |
|---|---|---|---|
| 3,879,653 | 4/1975 | Hyde | 324/316 |
| 4,070,708 | 1/1978 | Smallcombe | 324/307 |
| 4,296,378 | 10/1981 | King | 324/313 |
| 4,297,637 | 10/1981 | Crooks et al. | 324/309 |
| 4,318,043 | 3/1982 | Crooks et al. | 324/309 |
| 4,354,157 | 10/1982 | Feiner | 324/312 |
| 4,414,535 | 11/1983 | Ferriss | 324/304 |
| 4,471,305 | 9/1984 | Crooks et al. | 324/309 |
| 4,525,673 | 6/1985 | Berkowitz | 324/312 |
| 4,599,565 | 7/1986 | Hoenninger et al. | 324/309 |
| 4,665,366 | 5/1987 | Macovski | 324/309 |
| 4,707,797 | 11/1987 | Briggs | 324/307 |
| 4,709,212 | 11/1987 | MacFall | 324/309 |
| 4,806,866 | 2/1989 | Maier | 324/313 |
| 4,843,322 | 6/1989 | Glover | 324/309 |

OTHER PUBLICATIONS

"Microwire/Plus: Interface Made Easy", Abdul Aleaf and Richard Lazovick, National Semiconductor.

*Primary Examiner*—Michael J. Tokar
*Attorney, Agent, or Firm*—Nixon & Vanderhye

[57] ABSTRACT

A data communications network for magnetic resonance imaging (MRI) systems provides characteristics ideal for low noise operation and low cost at speeds as high as 1 Mbytes/sec and provides a serial data bus for performing medium speed control and data acquisition functions. System architecture is extremely versatile and also low in cost. Each node of the communications system may be provided with an interface implemented with electronically programmable array logic (EPLD) applications specific integrated circuits (ASIC) with 1800 equivalent gates per CMOS integrated circuit. The resulting chip set is self clocking (no local oscillator is required) and nominally provides 20 bits of latched output and input with parity checking in a four-chip set configuration. A minimal two-chip set configuration can be used for nodes that need only 4 bits of latched input and output data (while still supporting parity checking). Different types of peripherals can easily be accommodated, and the bus is self configuring.

18 Claims, 2 Drawing Sheets

SERIAL BUS NODE

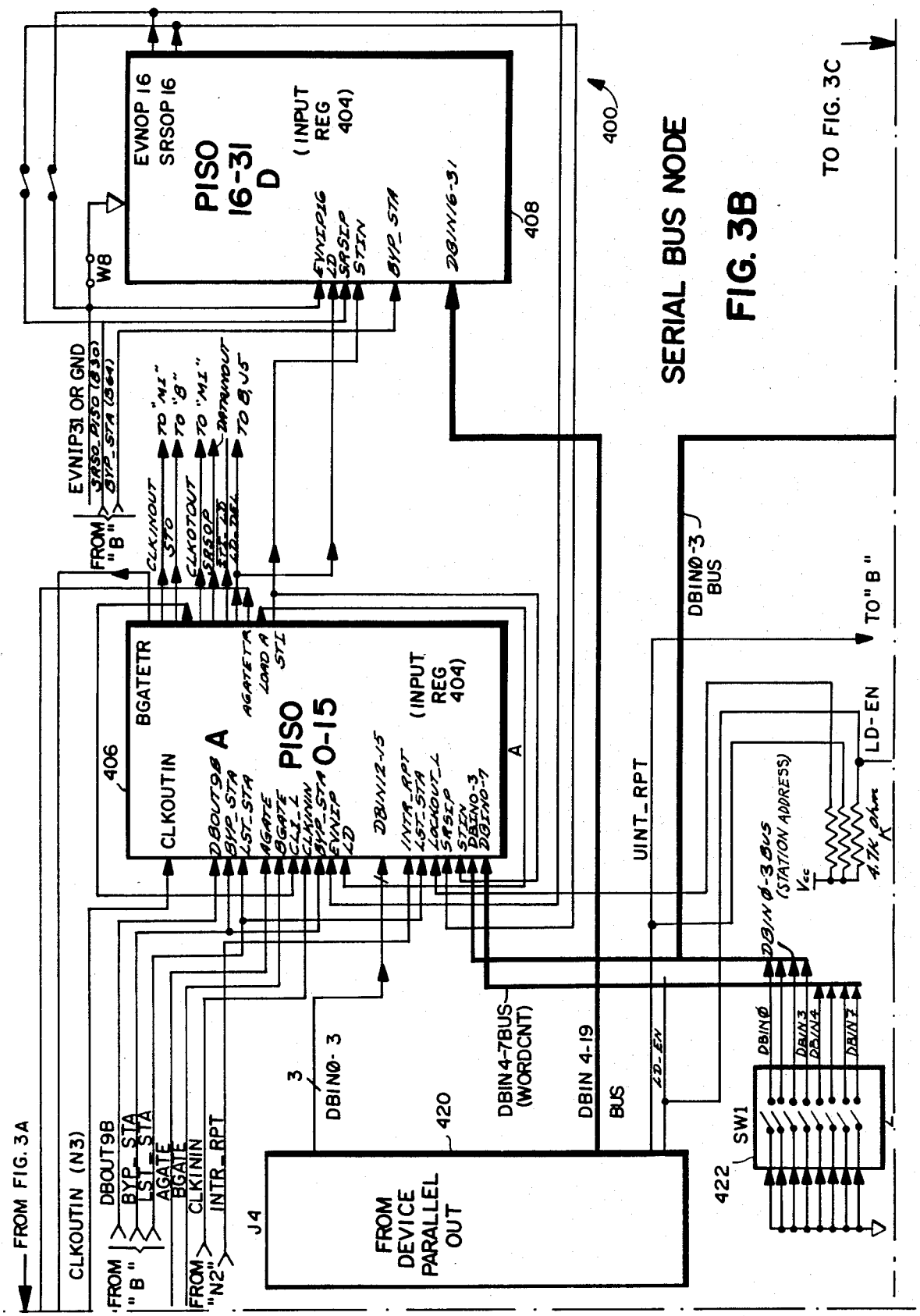

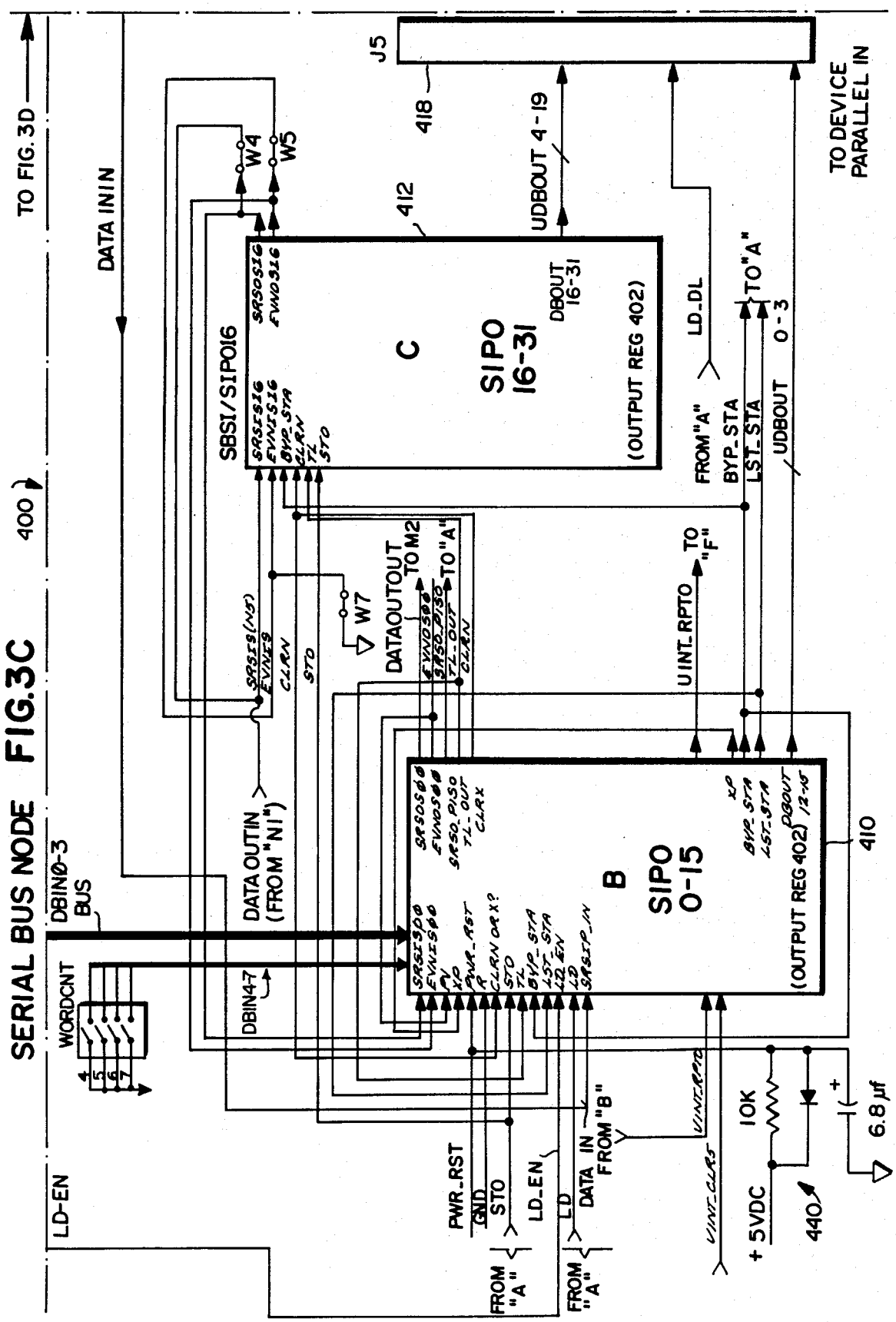

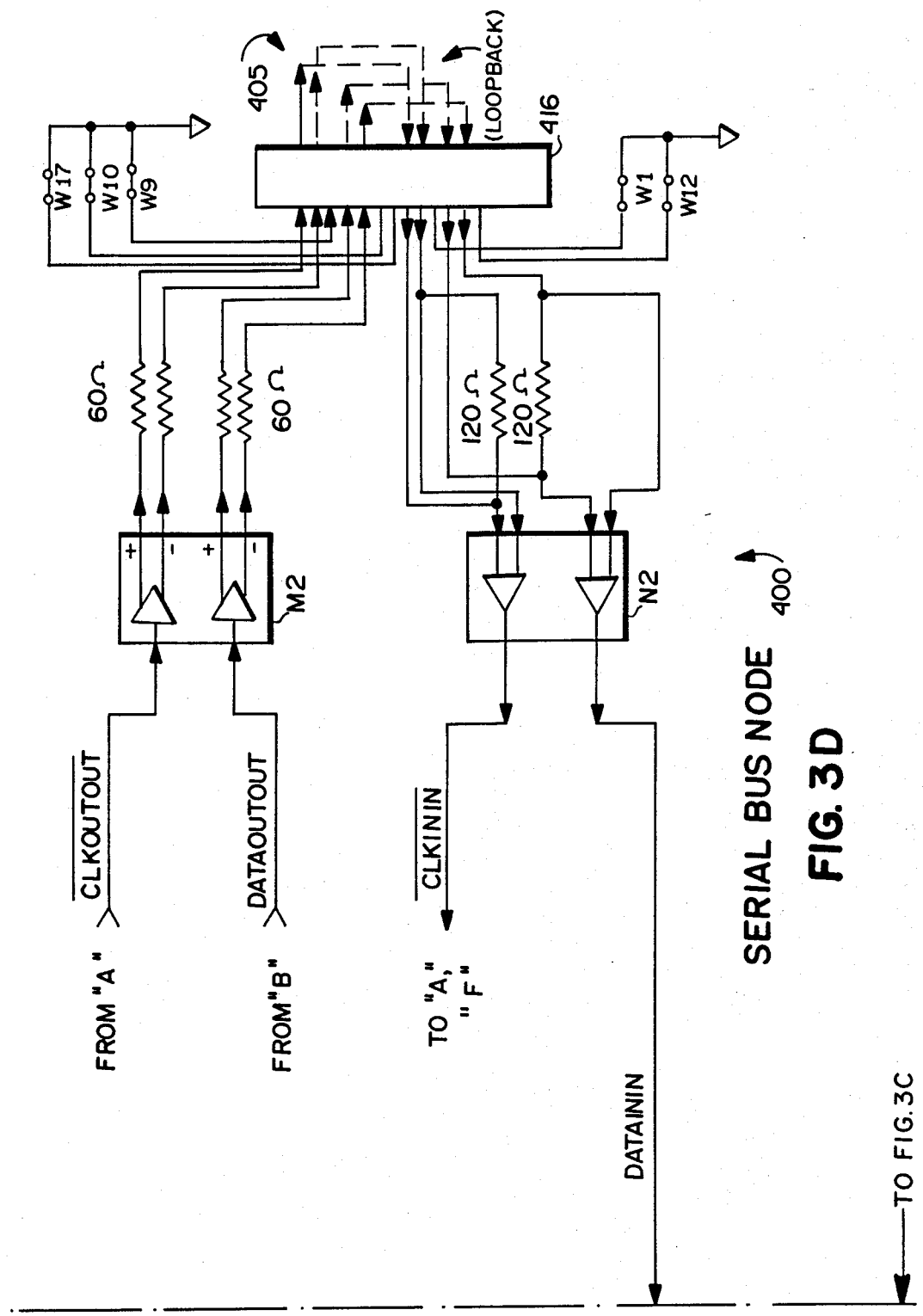

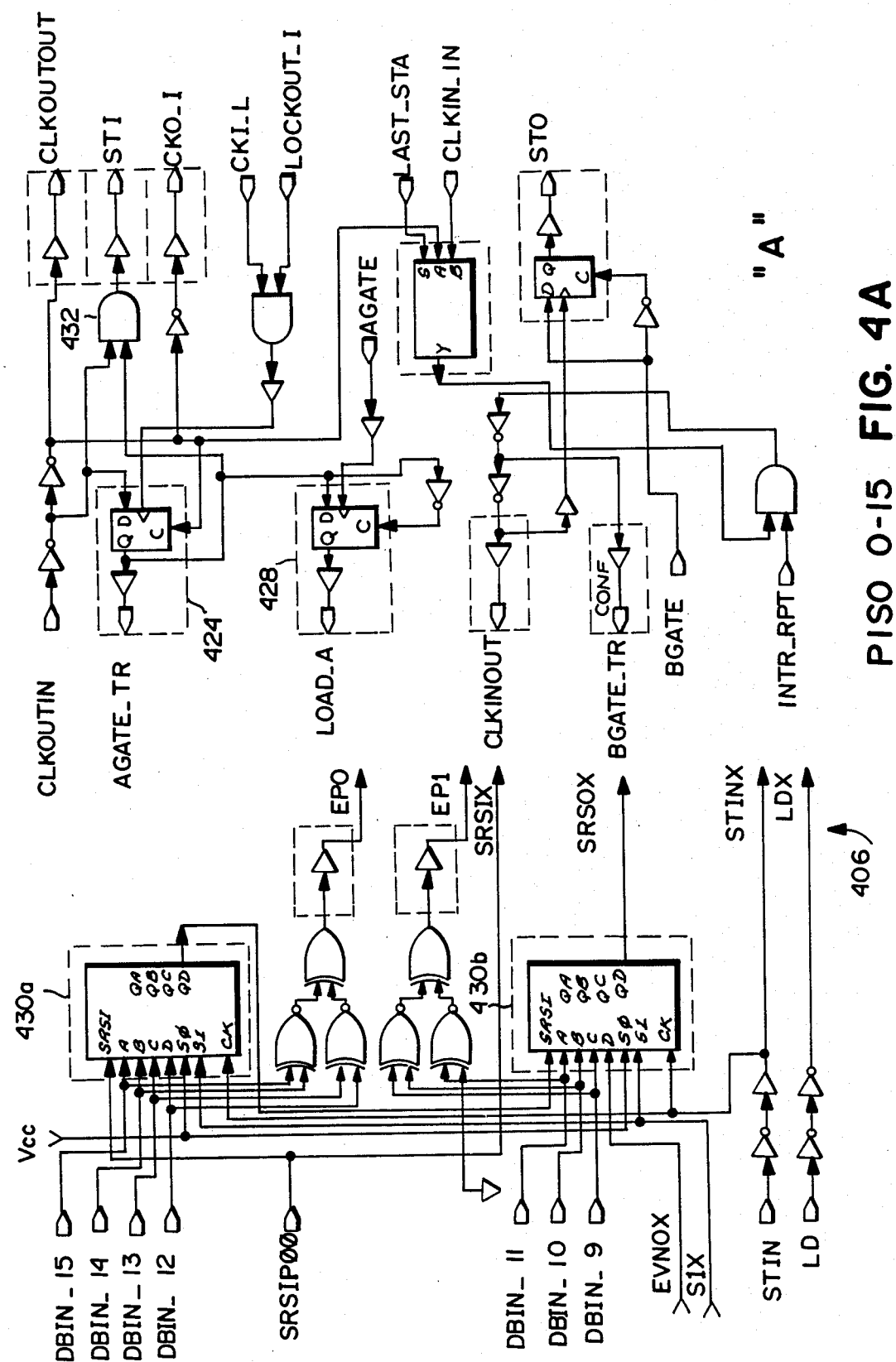
PISO 0-15 FIG. 4A

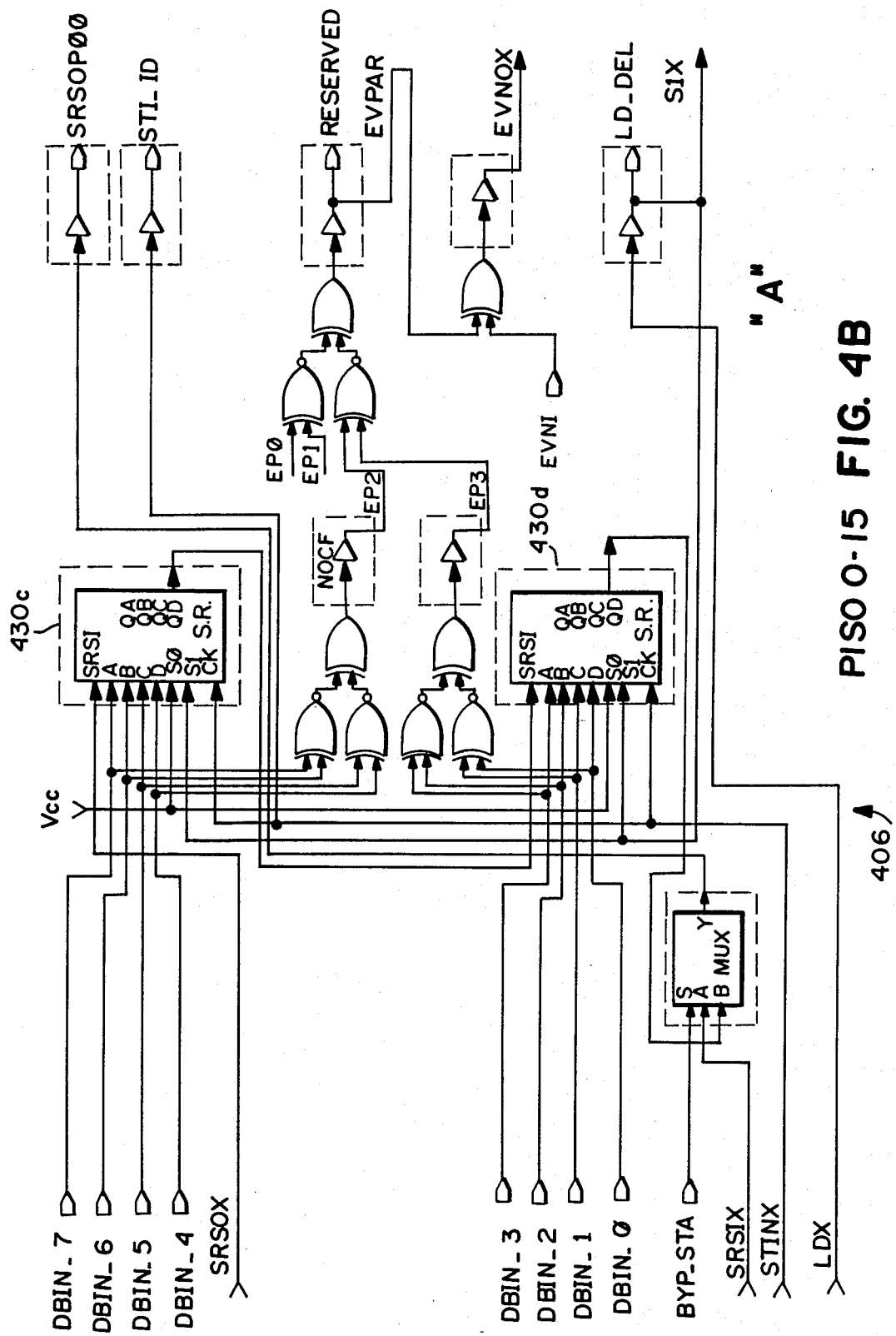
PISO 0-15 FIG. 4B

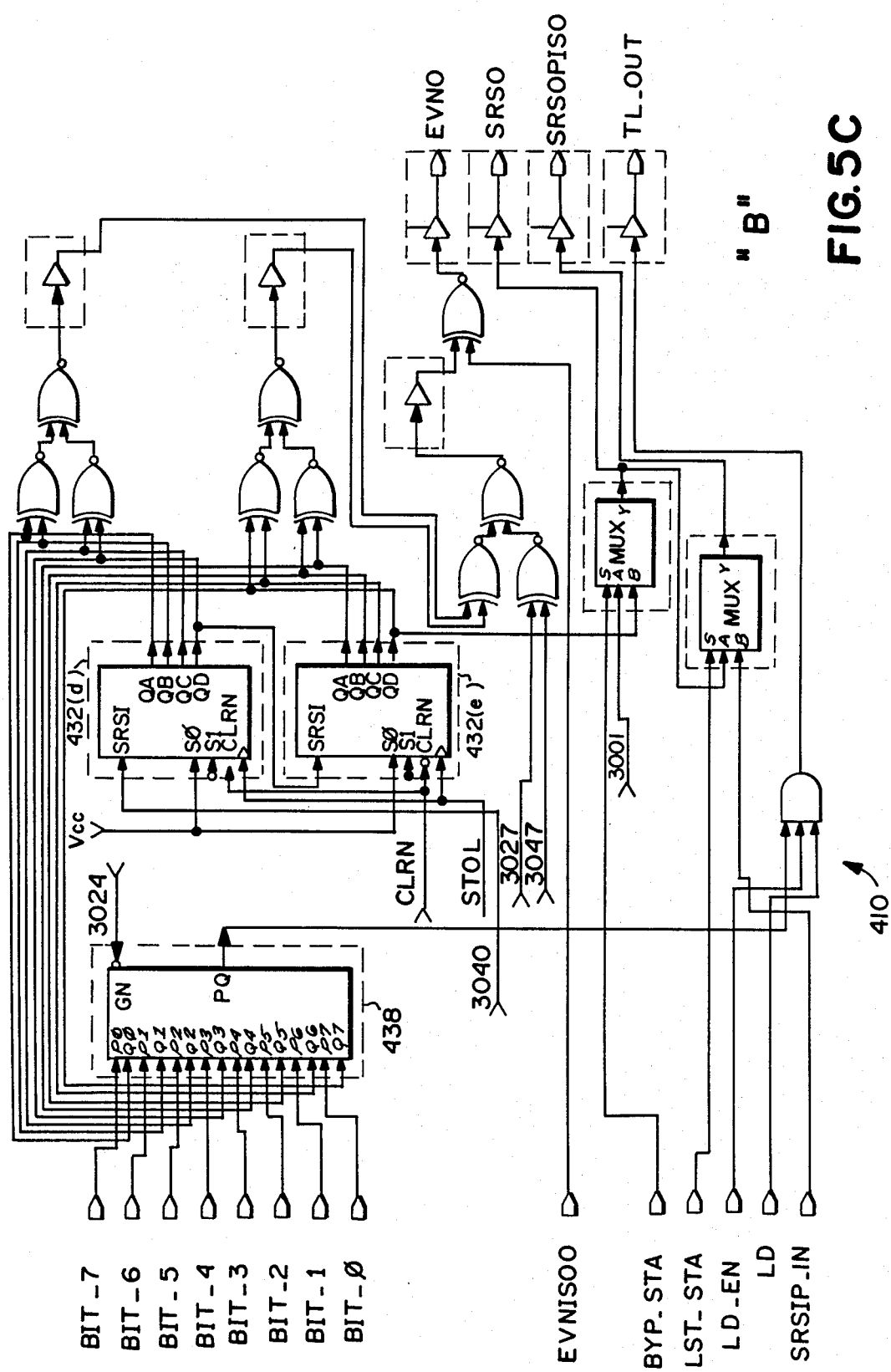
FIG.5C "B"

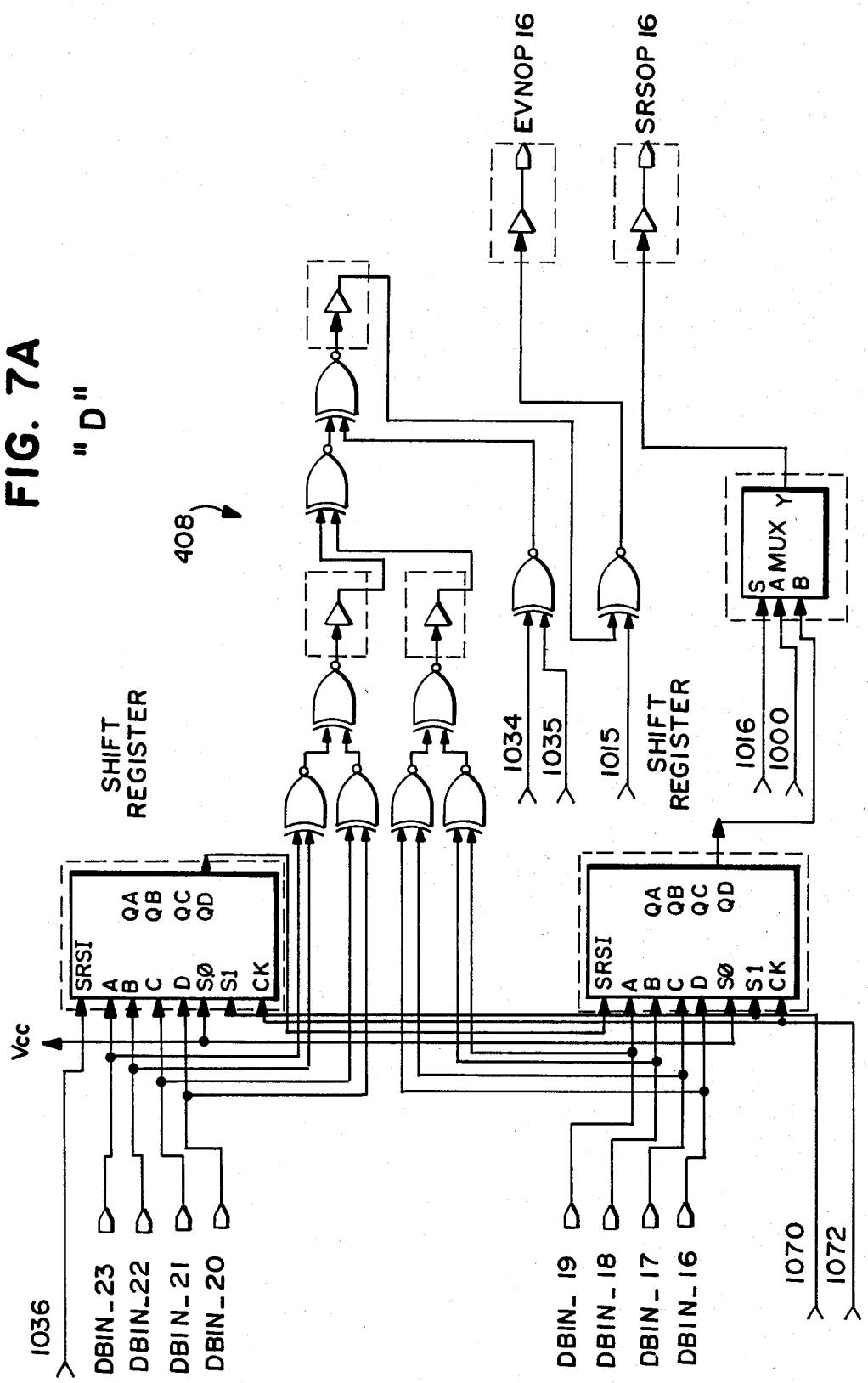

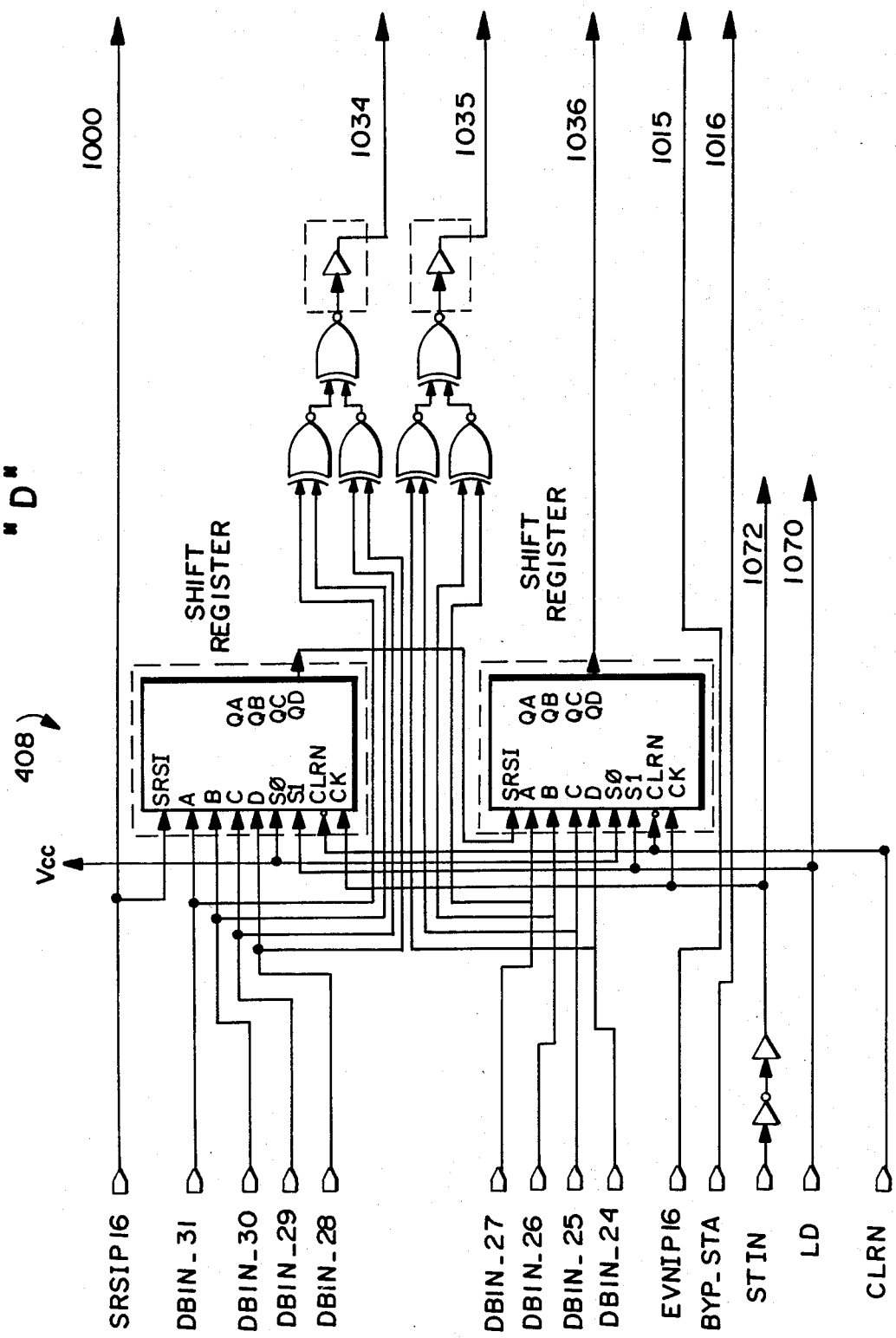
FIG. 7B "D"

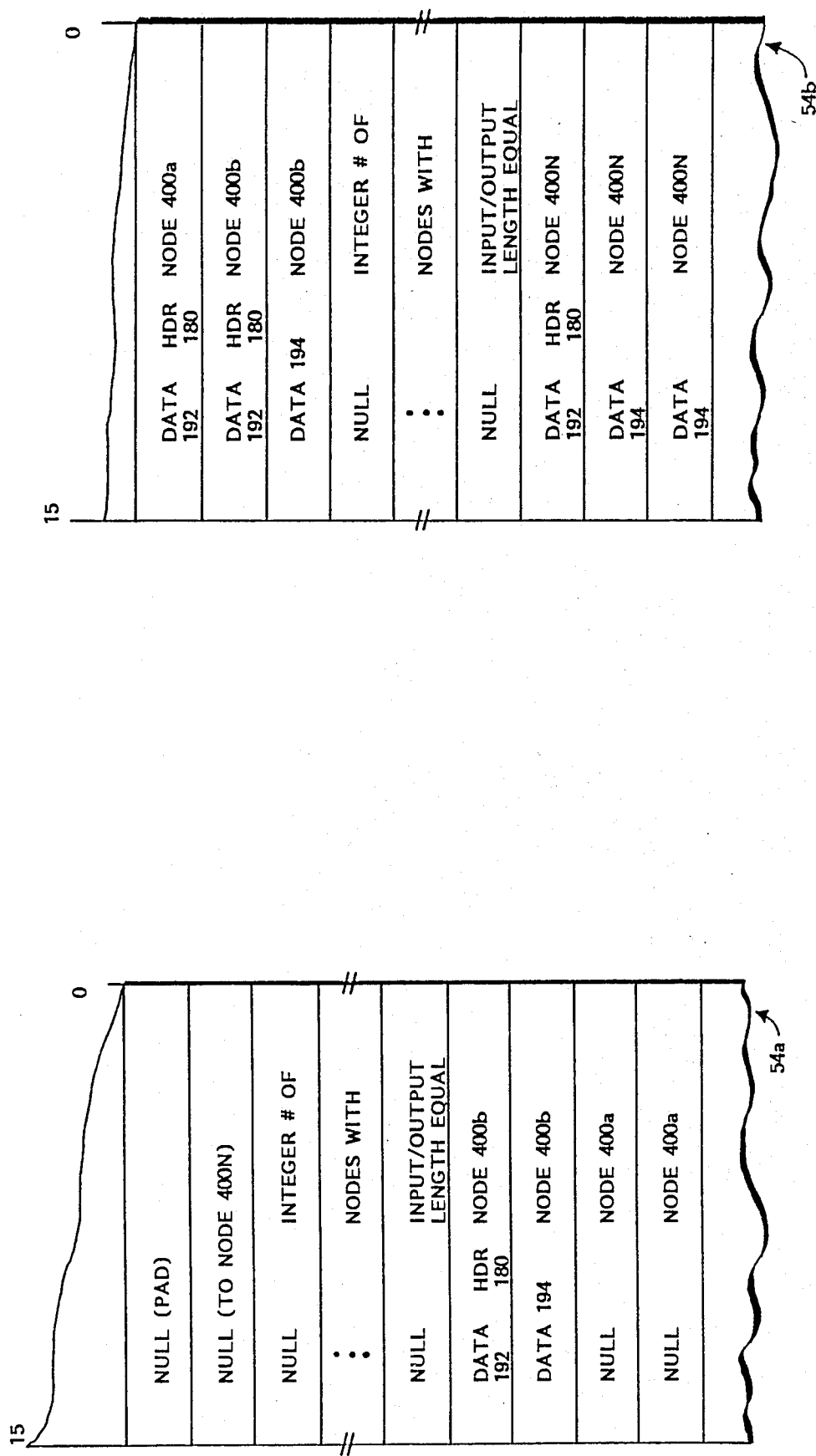

INITIALIZATION OF THE SERIAL BUS

SERIAL BUS PACKET TRANSFER

LOW DATA RATE LOW NOISE SERIAL DIGITAL COMMUNICATION LINK FOR MAGNETIC RESONANCE IMAGING SYSTEMS

CROSS REFERENCES TO RELATED APPLICATIONS

This application is a continuation-in-part of application Ser. No. 07/235,362 filed Aug. 19, 1988, and now abandoned.

FIELD OF THE INVENTION

This invention relates to magnetic resonance imaging ("MRI") systems, and specifically, to communicating digital control information within a magnetic resonance imaging system. More particularly, the invention pertains to communicating digital control information in serial form over a serial communications link connecting a digital computer with peripherals controlling various functions of a magnetic resonance imaging system.

BACKGROUND AND SUMMARY OF THE INVENTION

Magnetic resonance imaging ("MRI") systems of several different types are now commercially available. One exemplary type of MRI system is described in commonly-assigned U.S. Pat. Nos. 4,297,637 to Crooks et al, 4,318,043 to Crooks et al, 4,471,305 to Crooks et al, and 4,599,565 to Hoenninger et al.

A basic problem in such systems is how to communicate control signals back and forth between the various automatically controlled portions of the system. Typically, such systems include a central digital computer performing various control functions including controlling different portions of the system so that the portions work together (in the exemplary system, this central computer is provided in addition to another computer which performs image acquisition functions). It is generally desirable to connect one or more digital devices to the digital computer as "peripherals" of the computer so that the computer can directly control and interact with the devices.

For example, it is sometimes necessary to automatically, remotely tune or detune various RF circuits under stepper motor control as MRI scanning progresses and monitor the resulting reflected RF voltage/current with a reflectometer. Similarly, it may be desirable to move the platform or bed on which the patient is resting during scanning to obtain different views of internal organs—and perhaps to monitor actual bed position as the bed is moved. Increased scanning rates now make it possible to time scans relative to the patient's breathing cycle to eliminate movement artifact. For example, the patient may be asked by a technician to hold his breath, at which time the technician depresses a "breath holding switch" in the screen room. The MRI system preferably senses depression of this switch and acquires an image while the switch is depressed. Literally countless other potential applications (e.g., indicating and control functions, and especially diagnostic, fault detection, and fault recovery functions) exist which require signal communications between the central computer and peripheral devices.

Unfortunately, electronic noise is a very serious problem in MRI installations. Despite the very high RF and magnetic field levels typically used in MRI imaging for exciting the body to be imaged, the resulting response levels produced by the body are relatively small. Therefore, maintaining an acceptably high signal-to-noise ratio is often difficult—especially because of the relatively high gain "front end" amplifiers that must be used to obtain useful signal levels. Even when tuned input circuits are used to reject signal frequencies other than the frequencies of interest, wide spectrum noise emitted by a variety of common electronic devices (e.g., computers, display devices, and practically any device including digital circuitry) can seriously degrade signal-to-noise ratio and thus limit image resolution and quality.

As is well known, various precautions (some of which are rather elaborate and expensive) are typically taken to prevent noise sources from degrading the MRI process. For example, the patient, the gradient magnetic coils, and the RF generating/detecting circuitry are all typically located in a shielded "screen room" which isolates the signal detecting circuitry from external noise sources (and prevents high intensity RF energy from radiating outside of the room). The data acquisition and control computers are generally located outside of this screen room to prevent the wide spectrum noise they generate from interfering with signal detection. Individual components and subsystems are commonly enclosed in shielded, grounded metal cases, and power lines are typically shielded (both to impede the flow of high-powered RF signals and to prevent electronic noise generated by the components and subsystems from reaching the screen room detection circuitry).

However, digital circuitry operating at virtually any frequency produces wide spectrum electronic noise that can seriously degrade the MRI process if adequate precautions are not taken. Even conventional data transmitter and receiver circuitry (such as a conventional UART and associated baud rate generator) of the type typically used to connect computer input/output ports to computer peripheral devices acts as an electronic noise generator and generates too much electronic noise to be compatible with most MRI applications.

The noise problem is exacerbated by the complex data communications requirements typically found in an MRI imaging system. For example, MRI system peripherals to be connected to the central computer typically require different communications standards and protocols. Some devices may be RS-232C compatible, while others may not be. Digital protocol converters may be required to provide compatibility and permit all peripherals to be connected to the same data transmission network. These protocol converters (the most cost-effective and versatile ones of which are microprocessor-based and programmable) usually contain their own internal clock circuits and generate even more electronic noise. Electrostatic shielding can reduce but not eliminate the noise generated by such converters and associated circuitry and is generally expensive and difficult to install.

Reliability of communications is another serious problem. Extremely intense RF and magnetic fields typically exist in the MRI screen room. These fields can generate currents on data cabling which causes "glitches" in the data being transferred. A communications network suitable for use in MRI systems must function reliably even when such fields are present.

Because of the noise and reliability problems associated with placing additional digital control circuitry in the screen room, many in the past have simply refrained from providing such additional circuitry in the first place (thus foregoing the improved system performance and functions that might be provided through additional automation). A "quiet", cost-effective digital communications network that can be used to provide reliable communications between a control computer and several different peripheral devices located in an MRI screen room simply has not been available in the past.

Of course, many different types of serial data communications networks and interfaces exist for different applications. National Semiconductor has recently developed a bidirectional, high speed serial communications interface called "MICROWIRE/PLUS" for low cost interfacing between microcontrollers and external peripherals (or other microcontrollers). This interface standard uses a single 8-bit serial data input/serial data output shift register to connect a peripheral device data bus to the MICROWIRE/PLUS network. An internal or external shift clock can be selected for each network node to permit master and slave modes of operation. To transmit data over the MICROWIRE/PLUS interface, the master signals the slave over a slave interrupt port pin. When the slave responds indicating it is ready, the master generates a "shift clock" which causes 8 bits to be shifted out of its own shift register into the slave shift register (data already in the slave shift register is simultaneously shifted out to the master shift register, permitting simultaneous data reception and transmission). Both the master and the slave preferably include 16-bit CMOS HPC microcontrollers. Memory mapping permits the master and slave to directly address their respective shift registers through memory access instructions. Further information about the National Semiconductor MICROWIRE/PLUS interface may be found in National Semiconductor publications such as Applications Note "MICROWIRE/PLUS: Interface Made Easy" by Aleaf and Lazovick.

INTEL has also developed an INTEL bit bus which requires a microprocessor at each node.

However, these existing systems were not designed with the hostile environment of an MRI screen room in mind. For a data communications network to operate satisfactorily in the MRI screen room, it must suffer little or no degradation in performance when exposed to intense RF and magnetic fields—and must ideally produce no electronic noise whatsoever during the time an MRI image is being acquired. In addition, a suitable MRI data communications network should be capable of connecting many different types of peripheral devices to the same computer, and should provide sufficient versatility to permit different communications associated with different types of peripheral devices to be communicated.

The MRI data communications network provided by the present invention has been designed with characteristics ideal for low noise operation and low cost at speeds as high as 1 Mbytes/sec and provides a serial data bus for performing medium speed control and data acquisition functions in MRI systems.

Some of the significant advantageous features of the MRI serial communications system provided by the preferred embodiment of the present invention include:
  typical bus node configuration of 20 I/O data bits with address decode, parity and latched data output register in a 4-chip set;
  maximum speed of 1 Mbits/sec;
  bus node interrupt to host support;
  clock and data lines are not active when the bus is not in use;
  no local oscillator is required at bus nodes;
  bus may be transmitted by dual bidirectional fiber optical cables or four twisted pair cable with mixed cable types on the same bus;
  up to 32 bus nodes may be connected;
  loop back of data and clock signals are provided for high reliability;
  the bus is automatically self-configuring with no fixed order of nodes on the bus being required;
  the host has control of node disconnect (using built-in bypass mode at each bus node) for diagnostic support;
  reduced or expanded configurations for a node are supported, so that length of messages sent to and received from nodes can be customized on a node-by-node basis;
  low active device count in the node interface for low power consumption and higher reliability;
  low cost per bus node; and
  applications include remote RF coil tuning, patient bed position monitoring, breath hold image triggering, and automatic system hardware fault detection, diagnosis and logging.

The present invention provides a communications system architecture that is extremely versatile and also low in cost. In the preferred embodiment, each node of the communications system is provided with an interface implemented with electronically programmable array logic (EPLD) applications specific integrated circuits (ASIC) with 1800 equivalent gates per CMOS integrated circuit. The resulting chip set is self clocking (no local oscillator is required) and nominally provides 20 bits of latched output and input with parity checking in a four-chip set configuration. A minimal two-chip set configuration can be used for nodes that need only 4 bits of latched input and output data (while still supporting parity checking). If more than 20 bits of data input or data output are required, additional chips can be provided to increase data input and/or data output in 16-bit increments. The resulting node architecture provided by the present invention is thus easily expandable and customizable to the specific peripheral devices being connected.

In accordance with an important low noise feature of the present invention, the bus clock synchronization loop is active only when the bus host is actively sending and receiving data, and nodes on the bus require no internal clock circuits. Thus, the bus is entirely "silent" unless data is actually being transmitted and received (data transmission can be inhibited during image acquisition).

In accordance with another advantageous feature of the present invention, bus nodes may issue an interrupt request to the bus host when the clock loop is inactive—thereby initiating a message transfer.

In accordance with a further feature provided by the present invention, each bus node includes an input (to computer from node) serial data shift register and an output (from computer to node) serial data shift register—with all node shift registers connected in series to form a single, long shift register distributed along the communications network. In particular, the input of a node output shift register is connected to the output of the output shift register of the "previous" (closer to computer) node on the bus, and the output of the node output shift register is connected to the input of the output shift register of the "next" node (further away from the computer) on the bus. Similarly, the input of a node input shift register is connected to the output of the input shift register of the "next" node on the bus, and the output of the node input shift register is connected to the input of the "previous" node input shift register. The "last" node on the bus is "looped back", with the output of its output shift register connected to the input of its input register. This architecture is expandable, since any arbitrary number of nodes may be so connected. High reliability is achieved because all data signals are communicated within a closed loop.

In accordance with the another feature provided by the present invention, clock signals used for controlling the node shift registers originate at the bus host, are sent out on the bus over a separate clock loop, "loop back" at the last bus node, and return to the bus host. Significantly, the clock pulses travel around the bus in a direction opposite to the direction data pulses travel. That is, the input shift register of the "first" node on the bus receives the clock signal first—this same input shift register being the register which outputs bits of data to the central computer. This feature of the invention insures that data is stable and present at the input of any given node shift register by the time the clock pulse reaches that shift register. Two different clock pulse widths are used in the preferred embodiment one to signal data shift and the other to signal data load. The bus host sends out a clock pulse trailing edge only after it receives a looped back clock pulse leading edge, and doesn't send out a further data pulse unless it properly receives the looped back clock pulse. This loop back feature assures that all nodes are reliably clocked even when the system is exposed to high intensity RF or magnetic fields—since each node is guaranteed to have received a proper clock pulse if a proper looped back clock pulse is received by the bus host.

In accordance with yet another feature provided by the present invention, the serial communications bus is self-configuring. Each type of bus node is provided with a unique identification number. When the host computer initiates the serial bus, the host transmits a null buffer out over the bus and reads the data packets received in response. Each data packet returned to the host computer contains the identification of the node originating it and the packet length required by the node, so that the host can determining the identity, packet length, and relative positions of each node connected on the bus and the total number of nodes on the bus. Different types and numbers of nodes may be connected along the bus in any order, and the host computer need not be programmed beforehand with the bus configuration.

Any MRI peripheral subsystem can be designed to be connected to the serial communications system provided by the present invention preferred embodiment. The type of cable connection used between the serial bus nodes can vary depending upon system requirements (although the first leg into the screen room preferably comprises two bidirectional fiber optic cables). For example, once inside the screen room, shielded twisted pair cables may be used so long as noise (e.g., from MRI RF field coils) is not excessive.

BRIEF DESCRIPTION OF THE DRAWINGS

These and other features and advantages of the present invention will be better and more completely understood by studying the following detailed description of the presently preferred exemplary embodiment in conjunction with the appended sheets of drawings, of which:

FIGS. 3A, 3B, 3C and 3D are together a detailed schematic block diagram of one of the serial bus nodes shown in FIG. 1;

FIGS. 4A and 4B are together a detailed schematic diagram of integrated circuit "A" shown in FIG. 3B;

FIGS. 5A, 5B, and 5C are together a detailed schematic block diagram of integrated circuit "B" shown in FIG. 3C;

FIGS. 7A and 7B are together a detailed schematic diagram of integrated circuit "D" shown in FIG. 3B;

FIGS. 8A and 8B are schematic diagrams of memory maps of the exemplary contents of the host memory before and after a bus transmission cycle.

DETAILED DESCRIPTION OF THE DRAWINGS

Figure 1:
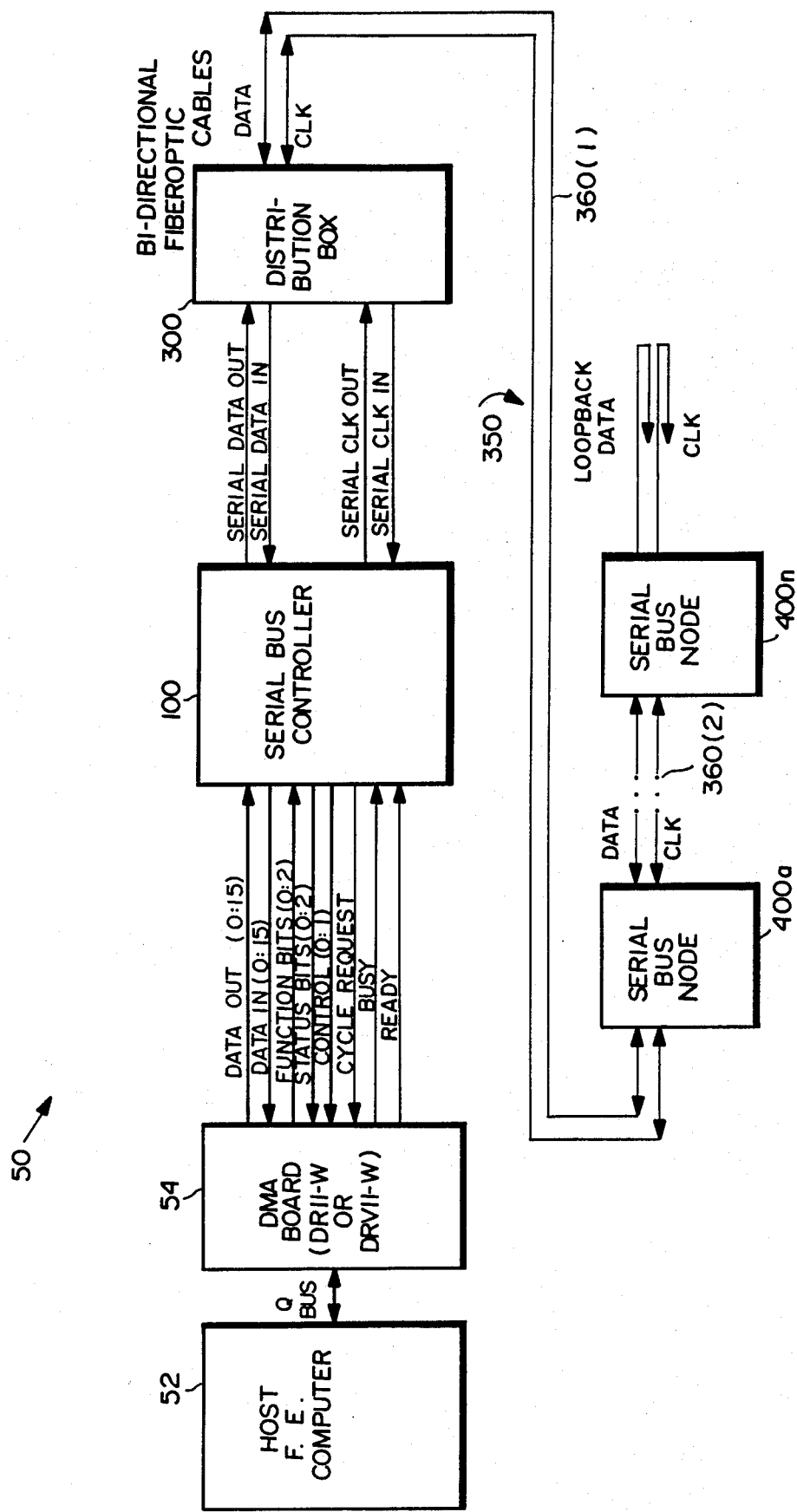
FIG. 1 is a high-level block diagram of the presently preferred exemplary embodiment of a serial data communications network provided by the present invention.

FIG. 1 is a schematic block diagram of the presently preferred exemplary embodiment of a serial data communications system 50 in accordance with the present invention. System 50 includes a host computer 52, a DMA board 54, a serial bus controller 100, a distribution box 300, and a serial data bus 350. Serial data bus 350 includes one or more serial bus nodes 400 connected by signal links 360.

In the preferred embodiment, bus host 52 is a MicroVax II 32-bit super-microcomputer used for providing control functions (but not image acquisition functions) in an MRI system. Host computer 52 may be connected via a standard, conventional "Q bus" in the preferred embodiment to a conventional MicroVax DMA board 54 type DRV11-W via a conventional "unibus" to a conventional DR11-W DMA board. The interaction between host computer 52 and DMA board 54 is well known to those of ordinary skill in the art. Briefly, host computer 52 may address any location in the DMA ("direct memory access") board 54 through memory access instructions executed by the host computer. In addition, DMA board 54 is capable of, by itself, transmitting data from its memory locations to the remainder of communications system 50 and receiving data from the communications system and storing this data into its internal memory without direct supervision or control by host computer 52. DMA board 54 provides a simple and reliable hardware port interface, and is the board type currently used for the ADC interface in the PDP-11/24 and the MicroVax II minicomputers manufactured by Digital Equipment Corporation (DEC) of Maynard, Mass.

Transfers to and from DMA board 54 are in the form of 16 bits of parallel data under user control. DMA board 54 permits write after read operations to main memory, this feature being used in the preferred embodiment to store received data in place of transmitted data in a single memory buffer. DMA board 54 automatically requests an interrupt from host computer 52 as soon as the total number of words to be transmitted/received have been transcribed, and host computer 52 responds to this interrupt request by reading and analyzing the received data (and possibly also by storing additional, responsive messages in the buffer for transmission).

The interface between DMA board 54 and serial bus controller 100 is a standard interface specified and defined by Digital Equipment Corporation and published in various documentation relating to the DR11-W and DRV11-W DMA controller boards. DMA board 54 sends serial bus controller 100 16 bits of parallel output (from host) data at a time, along with 3 "function bits", a busy signal (which indicates when the DMA board is occupied handling a host computer 52 memory access and is therefore unavailable for access by the serial bus controller), and a ready signal which indicates to the serial bus controller that the DMA board has completed its last requested operation and is ready to effect the next requested transfer to or from memory. Serial bus controller 100 sends DMA board 54 16 bits of parallel input (to host) data, along with 3 status bits (indicating the status of the serial bus controller), various control signals (which permit the serial bus controller to control aspects of the DMA board operation), and a cycle request signal (serial bus controller 100 asserts this cycle request signal when it needs to be serviced by the DMA board).

Overall Architecture of Bus 350

Figure 2:
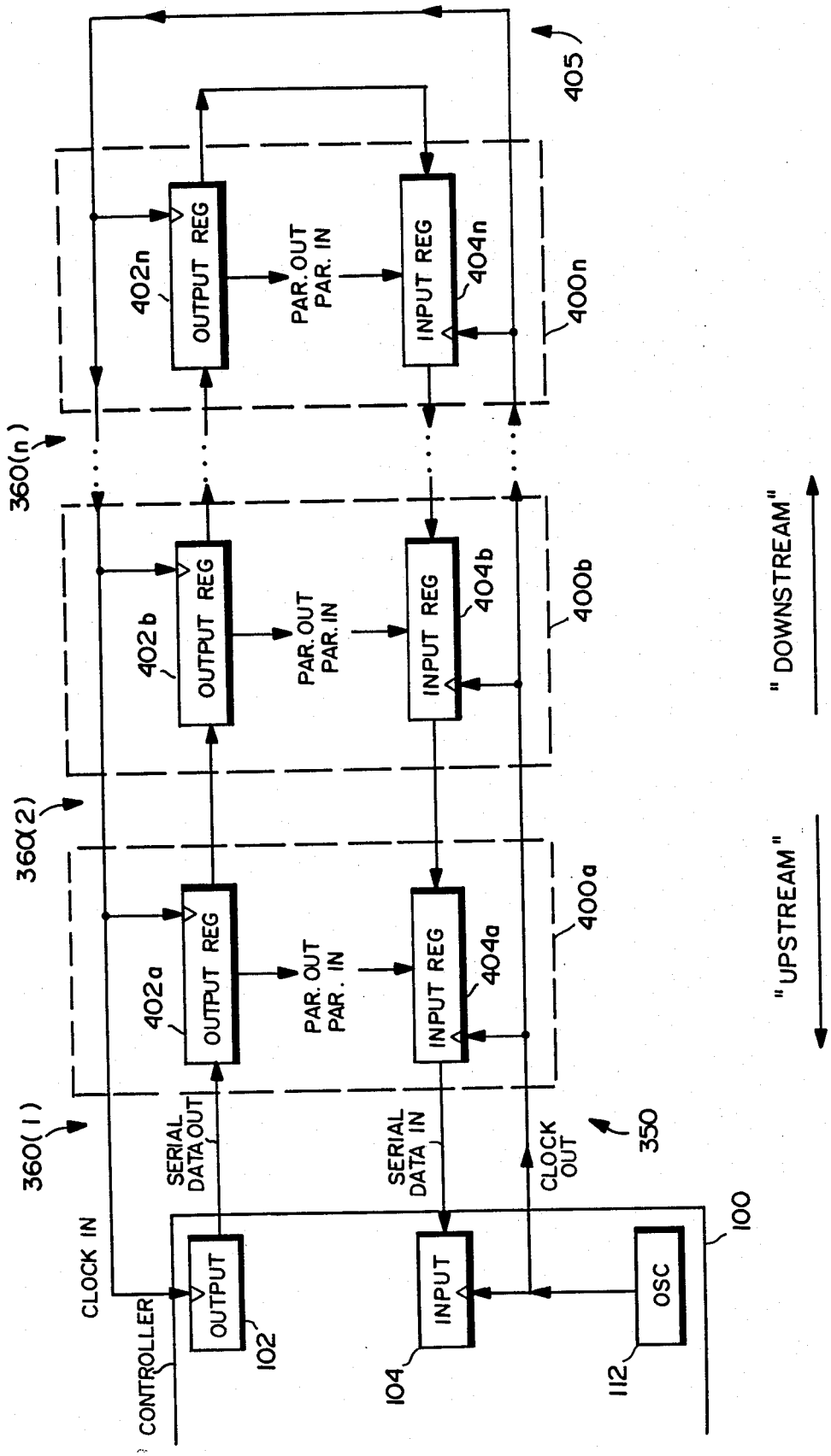
FIG. 2 is a high-level schematic block diagram of the overall architecture of the communications bus shown in FIG. 1.

FIG. 2 is a high level block diagram of the overall architecture of serial bus 350. For purposes of this and following discussions, the terms "output" and "input" generally are from the perspective of host 52. That is, "input data" refers to data being input to the host 52 from bus 350, and "output data" refers to data being output from the host to the bus.

FIG. 2 shows bus 350 including three serial bus nodes, node 400a, node 400b and node 400n. Node 400a is the most "upstream" or "first" node on bus 350, and is thus "closest" to host 52 and connected directly (via distribution box 300 in the preferred embodiment) to serial bus controller 100. Node 400n is the most "downstream" node on bus 350, and is thus the "last" node (the one "furthest away" from host 52). Node 400b is connected between node 400a and 400n. While virtually any desired number of serial bus nodes may be connected on bus 350 between the first node and the last node, in the preferred embodiment the total number of nodes is limited to 14 for reasons of data transmission efficiency. The first and the last nodes may be the same node if desired.

Serial bus controller 100 includes a serial data output shift register 102, a serial data input shift register 104, and a master clock generator 112. Each node 400 includes a serial data output register 402 and a serial data input register 404. Controller serial data output register 102 contains data produced by the host 52 for transmission to nodes 400 over bus 350, and controller serial data input register 104 is used to receive data produced by nodes 400 for input to the host. A serial data output line from controller 100 connects the output of controller serial data output register 102 to the input of output shift register 402a of node 400a. The output of output shift register 402a is connected to the input of output shift register 402b of node 400b, and so on, with the input of output register 402n of last node 400n being connected to the output of the output register 402 of the next-to-last on node bus 350. The output of output shift register 402n of the last node 400n is, in turn, connected to the input of input shift register 404n of that same last node in a so-called "looped back" connection 405. The output of the last node input shift register 404n is connected to the input of the input shift register 404 of the "next-to-last" node, and so forth, with the output of input shift register 404b of node 400b connected to the input of the first node input shift register 404a. The output of the first node input shift register 404a is connected via the "serial data in" input of controller 100 to the input of the controller input shift register 104. The controller 100 reads the contents of input shift register 104 in parallel and passes it to host computer 52 via DMA board 54 as input data from bus 350.

Figure 3:
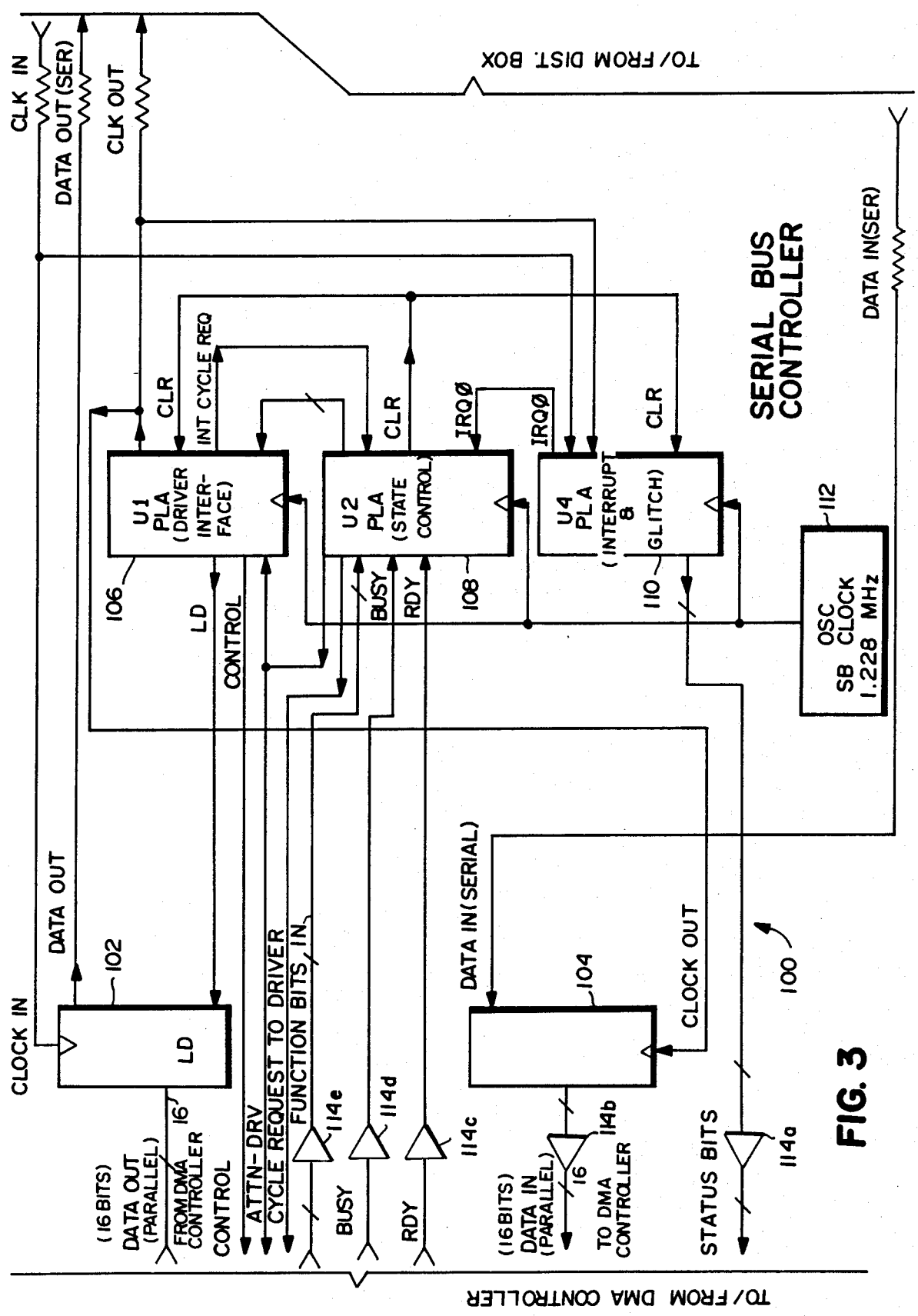
FIG. 3 is a detailed schematic block diagram of the serial controller block shown in FIG. 1.
Figure 3A:
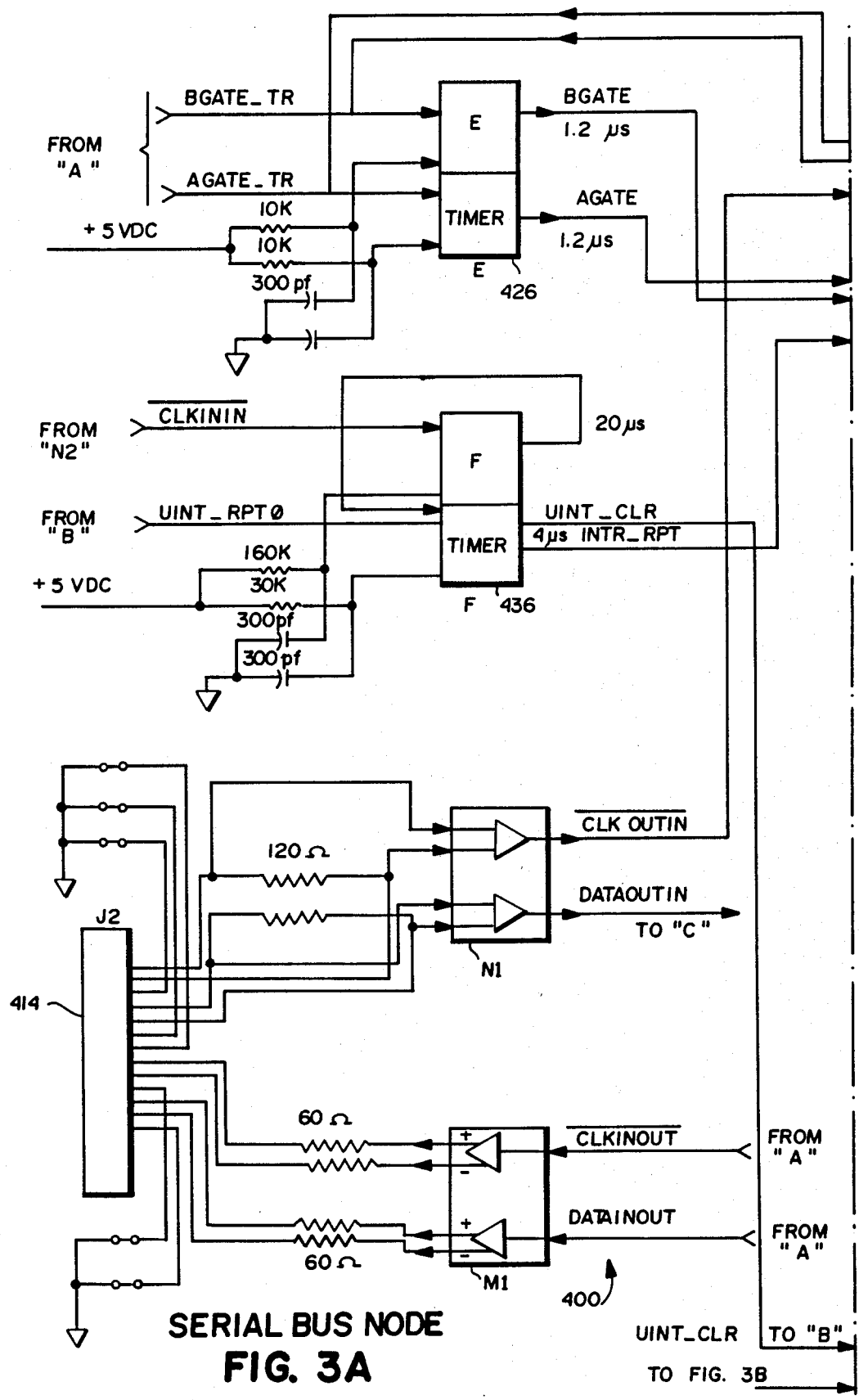

It can be seen from FIG. 3 that all of the output shift registers 402 are actually connected together in series with controller output shift register 102 to form a single long output shift register distributed among the controller and the various nodes 400a-400n. Similarly, all the input shift registers 404 are also connected together in series with controller input shift register 104 to form a single long input shift register distributed among the controller 100 and the various nodes 400a-400n. Because of looped back connection 405 at the last node 400n, the distributed output shift register comprising output registers 402, 102 is also connected in series with the distributed input shift register comprising input registers 404, 104 in the preferred embodiment.

In the preferred embodiment, all of the individual output shift registers 402 and all the individual input shift registers 404 are clocked by a common clock signal generated by controller master clock oscillator 112. This clock signal originates at the "clock out" output of controller 100, flows outward through nodes 400a-400n, is "looped back" at connection 405, flows back toward the controller through all of nodes 400n-400a, and flows back into the controller 100 to clock the controller output shift register 102. In the preferred embodiment, clock pulses flow in a direction around bus 50 which is exactly opposite to the direction in which bits of data flow.

To output a bit of data over bus 350 (available at the output of controller output shift register 102 shortly after the time this shift register is parallel loaded from DMA board 54), controller master oscillator 112 generates a clock pulse which first shifts the controller's own input shift register 104 by one bit and is then outputted onto the controller clock out line. This outputted clock pulse first encounters the input shift register 404a of first node 400a connected onto the data bus 350—causing this input shift register to shift its data one bit "toward" the controller. The clock pulse continues to flow outwardly over bus 350, shifting node input shift registers 404b-404n in progression. The same clock pulse is "looped back" at connection 405, and causes the last node output shift register 402n to shift its "last" bit to the input of last node input shift register 404n. The clock pulse then flows back toward controller 100, causing output shift registers 402n–402a to shift in progression. The same clock pulse finally is applied to the controller clock in input and causes the controller output shift register 102 to shift one bit place—making the "next" bit contained by this output shift register available at the input of first node output shift register 402a in preparation for the next bus clock cycle.

By causing the clock pulses to flow in a direction opposite to the data pulse flow, the preferred embodiment ensures that no input or output shift register is ever clocked before the bit being applied to its input is stable and has a defined level. In other words, when the clock pulse clocks first node input register 404a, the output of the next node input shift register 404b is guaranteed to be stable and defined (input shift register 404b has not been clocked since the last bus clock cycle and therefore has not changed state for a relatively long period of time). By causing the clock pulse to propagate on the bus 350 in the opposite direction the data pulses are propagating, there is no possibility that a clock pulse could ever cause any input or output register to shift in a value that is not stable—and there is no race conditions between the clock pulses and the data pulses (such race conditions could cause bit errors to be introduced into the data propagating along system 50).

It can be seen from FIG. 2 that not all output shift registers 402 have the same length, and not all input shift registers 404 have the same length. Moreover, the output shift register 402 of a given node may have a different length than that of the input shift register 404 of the same node. This flexibility and the resulting additional versatility is easily provided in the preferred embodiment because of the modular architecture of each of the serial bus nodes 400 (as will be explained in greater detail shortly in connection with FIGS. 3A–3D). While there are constraints in the preferred embodiment on the total number of bits contained in each of these shift registers (e.g., any given node shift register 402, 404 must have a length which is a multiple of 16 bits in the preferred embodiment), substantial additional flexibility is provided by permitting the system architect to decide, on a peripheral-by-peripheral basis, how many input and output bits will be provided for each type of peripheral. Some peripherals (e.g., displays and the like) may require a large number of bits outputted to them by host computer 52, and yet may provide only a few bits back to the host computer. Other peripherals (e.g., sensors such as reflectometers for RF tuning measurements) may require only a few control bits to be transmitted to them by host computer 52 but transmit a relatively large number of bits back to the host computer. Moreover, different types of peripheral devices may require different numbers of input and output bits (e.g., host computer 52 must send more bits to a 5-digit display device than to a 1-digit display device). These different requirements are easily accommodated by the architecture of system 50 in the preferred embodiment.

Figure 2A:
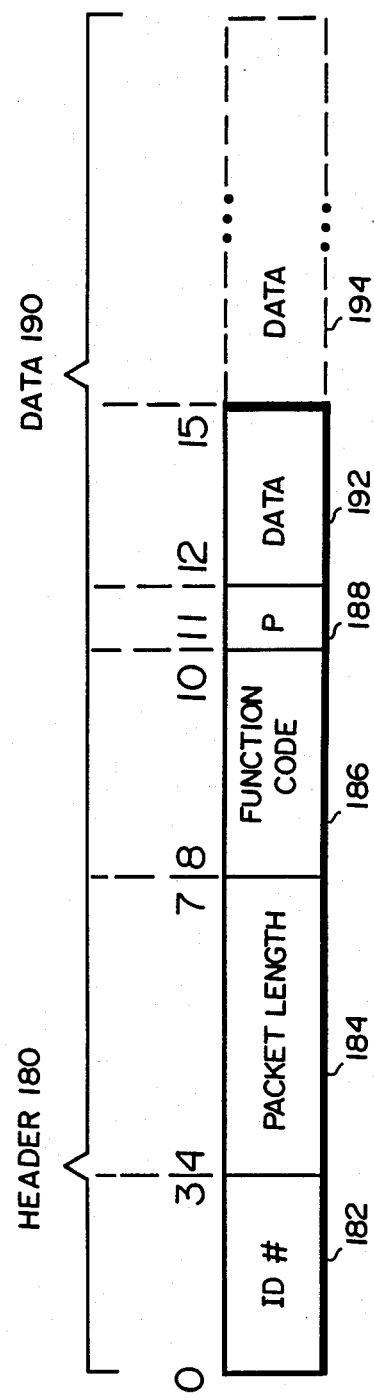
FIG. 2A is a block diagram of an exemplary packet format transmitted in the preferred embodiment shown in FIG. 1.

In the preferred embodiment, messages are sent to nodes in packets having lengths exactly corresponding to the lengths of the output shift registers of the nodes to receive the packets. Similarly, in the preferred embodiment, a node 400x originating a message to host 52 formats a packet having a length corresponding to the length of the node input shift register 404x. Input and output packets have the same format in the preferred embodiment, this format being shown in FIG. 2A.

The preferred exemplary message packet format includes a "header" portion 180 having a fixed length (12 bits in the preferred embodiment) and a data portion 190 having a variable length in the preferred embodiment. Header portion 180 carries "housekeeping" information needed to support bus 350, such as a 4-bit node type (or address) identification field 182, a 4-bit input packet length field 184, a 3-bit function code field 186, and a single bit parity field 188. The data portion 190 includes a minimum fixed 4-bit long data string 192 (making the preferred minimum packet length equal to 16 bits), and a variable length data string 194 (variable string 194 has a length which is an integer multiple of 16 in the preferred embodiment). Packet length field 184 in the preferred embodiment contains a binary representation of the number of 16-bit words contained in the packet—header as well as data bits (and thus corresponds to the length of the output shift register 402 of the intended node recipient for outgoing messages, or the length of the input shift register 404 of the node generating the message). Parity field 188 in the preferred embodiment protects the entire packet—header as well as data bits (it will be understood that other error correction information, such as CRC, could be provide instead of or in addition to parity information if desired).

For outgoing messages in the preferred embodiment, controller 100 and host 52 are responsible for shifting a sufficient number of bits before and after a message packet intended for a particular node so that the message packet is contained by the output shift register 402 of the intended node recipient at the time the controller causes the node to read its output shift register contents. In the preferred embodiment, all nodes 400 are controlled to perform a load operation at the same time (as will be explained). However, only those nodes 400 with "valid" message packets stored in their output shift register 402 will actually read any information from their shift register and make it available to their associated peripheral devices. In the preferred embodiment, one or more outgoing message packets are transmitted at any given time, so that one or more nodes 400 will have "valid" data stored in the respective node output shift register(s) 402 at the time the controller 100 transmits a load signal to all nodes.

For incoming messages in the preferred embodiment, controller 100 shifts the entire contents of the collective, distributed input shift register made up of all of node input shift registers 404a–404n through DMA board 54 memory before host 52 attempts to read any message packet. All nodes 400 originate a message packet each time the bus 350 becomes active in the preferred embodiment (the host 52 may choose to ignore some or most incoming message packets at certain times, depending on the reason the bus 350 was activated). Each node 400 generates a message header portion 180 and loads that message header portion into its input shift register 404 every time a load signal is received from controller 100 (in the preferred embodiment, this load operation is performed at the same time the node reads the contents of its output data register 402, and is performed by all nodes at essentially the same time in response to a special "load" type clock signal which controller 100 places on the bus clock loop). The nodes 400 also load their message packet data portions 192, 194 at this time—the particular data being loaded depending on the type of peripheral device associated with the individual nodes.

The overall architecture and operation of communications system 50 has been described. The detailed structure, function and operation of each of the components of system 50 will now be described in connection with FIGS. 3-7B.

Serial Bus Controller 100

In the preferred embodiment, serial bus controller 100 is in the form of a printed circuit board residing on the back plane of host computer 52, and is connected only to DMA board 54. A detailed schematic diagram of serial bus controller 100 is shown in FIG. 3. Serial bus controller 100 includes a data out (from host) shift register 102, a data in (to host) shift register 104, programmed logic arrays 106 (U1) (the PLA responsible for interfacing with DMA board 54), 108 (U2) (the PLA responsible for keeping track of the state of controller 100) and 110 (U4) (the PLA responsible for handling bus interrupts and detecting bus "glitches"), a master clock oscillator 112, and various input/output buffers 114.

Serial bus controller 100 initiates transfers from DMA board 54 16 bits at a time without incrementing the internal address counter of the DMA board (e.g., by controlling the control, "ATTN-DRV" and "CYCLE REQUEST" lines in the manner required by conventional DMA board 54). In response to the control signals asserted on these lines, DMA board 54 provides 16 bits of parallel output data on the data out lines which serial bus controller 100 loads in parallel into data out shift register 102. Serial bus controller 100 then begins the process of sending the contents of data out register 102 in serial form one bit at a time to bus 350 (via distribution box 300) over the serial data out line—and simultaneously clocks data appearing on its serial data in line from bus 350 into data in shift register 104 one bit at a time. When all of the 16 bits have been sent from data out shift register 102 and 16 bits have been received and stored in data in shift register 104, serial bus controller 100 causes the contents of the data in shift register 104 to be written to DMA board 54 into the same memory location the just-transmitted 16-bit data word was received from. Serial bus controller 100 then controls DMA board 54 to increment its address counter (e.g., via the control line and the status bit lines as required by the conventional DMA board) to the next location of a buffer maintained by the DMA board for communications.

In addition to the serial data out and serial data in lines connecting serial bus controller 100 to distribution box 300, there is also a "serial clock out" line and a "serial clock in" line connecting the controller with bus 350. Serial bus controller 100 generates (via driver interface PLA 106) a bus clock out signal in response to master clock oscillator 112 clock signals when the contents of data out shift register 102 are ready to be shifted out onto the bus 350 (e.g., in response to the RDY line signal produced by DMA board 54). Significantly, these bus clock signals generated by PLA 106 are used to clock each of the serial bus 350 nodes 400—and also to clock the data stream from data out shift register 102 onto the bus 350. Specifically, in the preferred embodiment the clock out bus clock signals generated by PLA 106 are transmitted to the "most upstream" node 400A on bus 350 (shown in FIG. 1), which passes them on to each of the other nodes in turn. When the clock signal reaches the "last" node 400N (see FIG. 1), it is looped back and returns through all of the nodes to appear on the clock in line input of serial bus controller 100. This same clock pulse, after having traversed the entire length of the communications bus 350 (out and back again), is used to clock the next bit of data from data out shift register 102 onto the bus 350. In the preferred embodiment, serial bus controller 100 requires the leading edge of a clock pulse appearing on the clock in line to be received until the trailing edge of the same pulse is transmitted over the clock out line in order to improve noise immunity. PLA 110 also senses whenever a clock pulse applied to the clock out line fails to "loop back" and return to the controller 100, and interrupts the DMA board 54 (via PLA 110 IRQ0 output which PLA 108 processes to produce DMA board interrupt request on line ATTN-DRV) whenever this occurs (in such instances, PLA 110 provides a status bit code that informs the DMA board that a bus error occurred).

Controller 100 is also responsible for alerting DMA board 54 when a node 400 requests a bus cycle. As will be explained, nodes 400 are capable of requesting a bus cycle by applying a special, extra wide clock pulse onto the clock in line. PLA 110 senses for such extra wide pulses (whenever the controller is enabled by the "function bits" applied to it by DMA board 54 to respond to external interrupts). When a node interrupt request is received, PLA 110 produces an IRQ0 output which PLA 108 translates into an ATTN-DRV signal for interrupting the DMA board 54. DMA board 54, in turn, interrupts host 52 (via the "Q" bus). The host 52 may service the interrupt by causing a bus cycle to occur (as will be explained in connection with FIGS. 10A-10B).

In the preferred embodiment, serial bus controller 100 may support plural serial buses 350 and simply multiplex the various signals to the appropriate bus. An additional PLA 110 may be provided for each additional serial bus 350 along with multiplexers for multiplexing the clock pulses onto the appropriate bus, directing the serial data out line to the appropriate bus, and directing the serial data in line of the appropriate bus to input shift register 104. The interaction with DMA board 54 provided by PLA 108 and the state control functions provided by PLA 108 remain the same regardless of which bus 350 is being activated, so that only a single version of these PLAs need to be provided so long as simultaneous communications over multiple buses 350 is not required.

Distribution Box 300

In the preferred embodiment, the serial data out clock in signals on communications links 360 connecting nodes 400 together and connecting first node 400a to controller 100 may in some cases be carried by the same bidirectional optical fibers with appropriate TTL-to-optical signal conversion circuitry used to separate the two signals (e.g., different wavelengths of lights may be used to differentiating between the clock and data signals). Similarly, the serial data in and clock out signals may be carried by another bidirectional optical fiber. In other cases, the links 360 may comprise shielded twisted pair cables. Distribution box 300 in the preferred embodiment includes circuitry which converts the TTL level serial and clock signals present on the controller serial data out line and the controller clock out line from electrical to optical signals and applies those optical signals to bidirectional fiber optic cables entering the MRI screen room. Distribution box 300 also contains additional circuitry which converts optical serial data in and clock in signals returning from the screen room over the bidirectional fiber optic cables into TTL levels and applies the resulting TTL levels to the clock in and serial in inputs of serial bus controller 100. The use of fiber optic cables between controller 100 and the first node 400 located in the MRI screen room insures that no conductive links exist between any system 50 component outside of the MRI screen room and any system component within the MRI screen room. While it is preferable that the link between distribution box 300 and first serial bus node 400a within the screen room be via these bidirectional fiber optic cables, conventional four twisted pair cables may be used to connect the serial bus nodes within the screen room together as desired. Likewise, any nodes 400 outside of the screen room may be connected to distribution box 300 or to one another via conventional shielded twisted pair cable if desired.

Bus Nodes 400

FIGS. 3A–3D are detailed schematic diagrams of the presently preferred exemplary embodiment of a serial bus node 400 (e.g., node 400n) in accordance with the present invention. The heart of serial bus node 400 is a chip set of at least 2 (and generally 4 or more) applications specific custom integrated circuits 406–412. In the preferred embodiment, the minimal configuration for any node 400 is one "A" parallel-in-serial-out chip 406 (which acts as a 16-bit wide input shift register 404); and one "B" serial-in-parallel-out chip 410 (which acts as a 16-bit wide output shift register 402). This minimal configuration is capable of receiving a 16-bit wide message packet from host computer 52 (12 of the 16 bits being "header" portion 180 in the preferred embodiment leaving 4 bits for data portion 190), and is capable of passing a 16-bit wide packet back from the peripheral to the host computer (12 bits of the packet being "header" portion 180 with 4 bits in the data portion 190).

If a peripheral must transmit additional output bits to host computer 52, one or more additional parallel-in-serial-out "D" chips 408 are also included in node 400. In the configuration shown in FIGS. 3A–3D, one such additional "D" chip 408 is provided—extending the width of the input shift register 404 associated with the node to a total of 32 bits (12 bits of which comprise "header" portion 180 with a 20-bit wide data portion 190). Each "D" chip 408 provided adds another 16 bits of data to the data portion 190 of messages transmitted by the node 400 (the same amount of header information is used in the preferred embodiment regardless of the length of the data packet being transmitted from the node to the host computer 150, so only a single "A" chip is required no matter how many "D" chips are used).

Similarly, the configuration shown in FIGS. 3A-3D includes an additional serial-in-parallel-out "C" chip 412 to provide a 32-bit wide output shift register 402 (and thus enable the node 400 to receive a 32-bit wide message packet from host computer 52). Of these 32 bits, 12 bits comprise "header" portion 180—leaving 20 bits for data portion 190. If only 4 or fewer bits of data need to be transmitted from host computer 52 to a particular node 400 at any given time, the "C" chip 412 shown in FIG. 3C may be dispensed with (since the "B" chip 410 is capable of handling 4 bits of data as well as all of the header information). On the other hand, if more than 20 bits of data must be transmitted from host computer 52 to a particular node 400, additional "C" chips 412 may be provided to expand the width of the equivalent output shift register 402B associated with the node 400 in increments of 16 data bits for each additional "C" chip added.

A node data connector 414 connects to the portion of the bus 350 most "upstream" (i.e., closest to controller 100), and a further data connector 416 connects with the bus at a point "downstream" (i.e., away from the controller). Thus, in the preferred embodiment, data connector 414 is connected either directly to controller 100 (via distribution box 300), or to another node 400 connected between the node of which the connector is a part and the controller. Data connector 416 is connected to either another node 400 "farther away" along the bus 350 from the distribution box 300 (or is "looped back" with connection 405 if the node is the "last" node on the bus).

Connectors 414, 416 are standard data connectors in the preferred embodiment for connection with standard shielded twisted pair cables. A "dummy" plug is connected to the data connector 416 of the "last" node on the bus 350 to effect "loop back" connection 405. If an optical fiber connection is required (e.g., if the node is the first node within the screen room), conventional optical interface components of the type described previously are connected to data connector 414 to provide signal conversion between optical signals and TTL signals. Buffers M1, N1, M2 and N2 provide TTL buffering and isolation for all signals received and transmitted via connectors 414, 416.

The serial data out line entering node 400 via data connector 414 (this line carries data signals out from central computer 52 into the node) is connected to an input SRSIS16 of "C" chip 412 in the configuration shown. "C" chip 412 acts as a 16-bit shift register (e.g., the "upstream" 16 bit portion of output shift register 402). As "C" chip 412 shifts in serial bits one bit at a time, it shifts out its previous contents one bit at a time to its "SRSOS16" output—this output being connected to the SRSIS00 input of "B" chip 410. In the configuration shown, "B" chip 410 acts as the "downstream" 16-bit portion of output shift register 402. As "B" chip 410 shifts bits in from the "C" chip SRSOS16 output, the "B" chip shifts out bits on its SRSOS00 line to the input of "M2" buffer (as the signal "DATAOUTOUT") and via data connector 416 to the "next" node "downstream".

If more than one "C" chip 412 is provided, the "C" chips are connected in series with one another with the SRSOS16 output of one "C" chip connected to the SRSIS16 input of the next "C" chip and the SRSOS16 output of the "last" "C" chip connected to the SRSIS00 input of the "B" chip 410. There can be as many "C" chips 412 per node as desired, but only one "B" chip 410 per node is necessary in the preferred embodiment.

The "B" chip 410 provides 4 bits of parallel output data DBOUT 12-15 (data portion 192) to a parallel data connector 418, and the "C" chip 412 provides a full 16 bits DBOUT 16-31 of latched output data (data portion 194) to this parallel data connector. Thus, in the configuration shown, 20 bits of parallel data are provided to the peripheral device connected to the node 400. Providing additional "C" chips 412 increases this number of data bits in multiples of 16 bits for each additional "C" chip provided. The "B" chip 410 also performs a variety of control functions associated with header portion 180 (e.g., error checking, validity checking, loading control, and the like) as will be explained.

The DATAININ connection of data connector 416 is received from the next "downstream" node on the bus 350 (or from the loopback 405 if the node is the last node on the bus). This DATAININ line is first applied in the preferred embodiment to an input of "B" chip 410 called SRSIPIN. The "B" chip 410 typically simply passes (through a multiplexer) this signal on to its SRSOPISO output pin (which is connected in the preferred embodiment to the SRSIP input of "D" chip 408). "D" chip 408 acts as the most "downstream" portion of the input shift register 404 for the node 400 (for handling the data portion 194 of messages to be sent to host 52). As "D" chip 408 shifts data bits in from the DATAININ line, it shifts its current contents out one bit at a time onto its SRSOP16 output. This SRSOP16 output is connected to the SRSIP00 input of "A" chip 406 in the configuration shown. The "A" chip 406 acts as the most "upstream" portion of the input shift register 404 for the node 400 and handles the header portion 180 and 4-bit data portion 192 of message packets being sent to host 52. As the "A" chip 406 shifts bits in from the "D" chip 408, it shifts out its current contents (one bit at a time) onto its SRSOP00 output. This chip "A" SRSOP00 output is connected to the input of buffer M1 and to the Serial Data In (to central computer 52) line via data connector 414.

"A" and "D" chips 406, 408 are loaded in parallel with data carried by a DBIN data bus, this parallel data bus being connected to the parallel output of the peripheral device connected to node 400 via a parallel data connector 420. In the configuration shown, parallel data bits UDBIN0-3 are connected from connector 420 to the input of "A" chip 406 (and correspond to data portion 192 of the message packet), and parallel data bits UDBIN4-19 (corresponding to data portion 194 of the message packet) are connected from the data connector to the input of "D" chip 408—for a total of 20 bits of data in the configuration shown. If the peripheral produces only 4 or fewer bits of output data, the "D" chip 408 can be dispensed with and the SRSOPISO output of "B" chip 410 can be connected directly to the SRSIP00 input of "A" chip 406. If more than 20 bits of data must be conveyed from the peripheral to central computer 52, additional "D" chips 408 can be connected in series with the "D" chip shown (each additional "D" chip providing an additional 16 bits of output data capability).

As mentioned, the "A" chip 406 is responsible for generating the "header" information that is part of every message generated by node 400. Part of this "header" information is a 4-bit identification number specifying the type of peripheral connected to the node. This 4-bit identification number is provided by a DIP switch bank 422 connected to the DBIN00-DBIN03 inputs of "A" chip 406 (and is thus programmed at the time the node is installed by selecting appropriate positions for the DIP switch). Additional switches in the DIP switch bank 422 permit selection of the number of words using DBIN04-07. The computer selects different options for operating node 400 (e.g., inhibiting loading of parallel information into the "A" and "D" chips 406, 408 and inhibiting the node from generating interrupts requesting service from the central computer 52).

In the preferred embodiment, two different types of clock signals are generated by serial bus controller 100, one type of clock pulse being wider than the other. A clock pulse of one width controls all "A" and "D" chips 406, 408 (and all "B" and "C" chips 410, 412) to perform a parallel load. A clock pulse of a different width causes all of chips 406–412 to shift one bit place. The CLKOUTIN line provided via data connector 414 and buffer N1 from nodes "upstream" on the bus 350 is applied to the CLKOUTIN input of the "A" chip 406. This CLKOUTIN signal is tested for duration by a flip-flop 424 (see FIGS. 4A–4B) and a 1.2 microsecond timer 426 external to chip "A" (see FIG. 3A) to generate an "AGATE" signal which triggers a further flip flop 428 to generate the chip "A" output signal LOADA. This LOADA signal is tied back to the LD input of "A" chip 406 and causes the S1 inputs of the various shift registers 430 shown in FIGS. 4A and 4B to operate in the "LOAD" mode. Shift registers 430 internal to chip "A" are clocked by the signal "STIN" which is produced by the "A" chip 406 as signal STI (this signal is derived by gate 432 from the CLKOUTIN signal and from the state of flip-flop 424). This STIN signal is also applied to the STIN input of the "D" chip 408 to clock that chip. The LDDEL signal produced by "A" chip 406 (this LDDEL signal is merely a buffered version of the LD signal) causes the "D" chip 408 to operate in the load or shift mode, as appropriate. The "A" chip 406 also applies this LDDEL signal to the LD input of "B" chip 410 to control the "B" chip to operate in the load or shift mode as appropriate (since in the preferred embodiment, input registers 404 and output registers 402 simultaneously load or sequentially shift).

The internal shift registers 432 within "B" chip 410 (see FIGS. 5A–5C) are clocked by the STO output signal produced by the "A" chip 406. Thus, the "A" chip includes most of the circuitry in the preferred embodiment to control the synchronization of chips 406–412. The "A" chip is responsive to the CLKININ signal (derived from data connector 416 from the next node "down stream" on serial bus 350), this shift signal being used to clock output register 402 (and thus "B" chip 410 and "C" chip 412 which implement this output register). The "A" chip uses external timer 426 to help detect when a shift pulse is present on the CLKININ line, and produces the STO signal (as well as intermediate signal BGATE) used by the "B" and "C" chips to synchronize their internal shift registers.

Figure 5A:
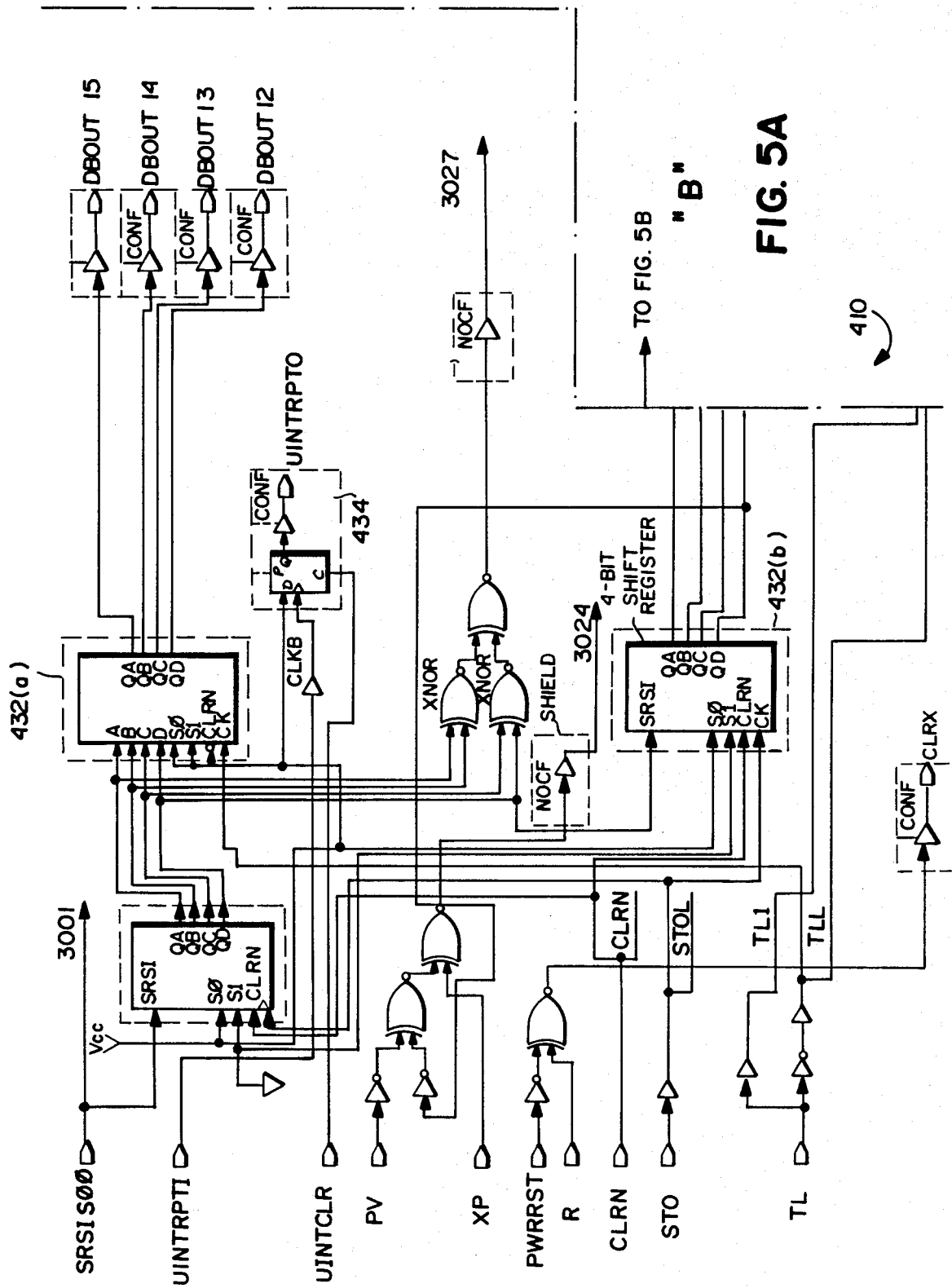
Figure 5B:
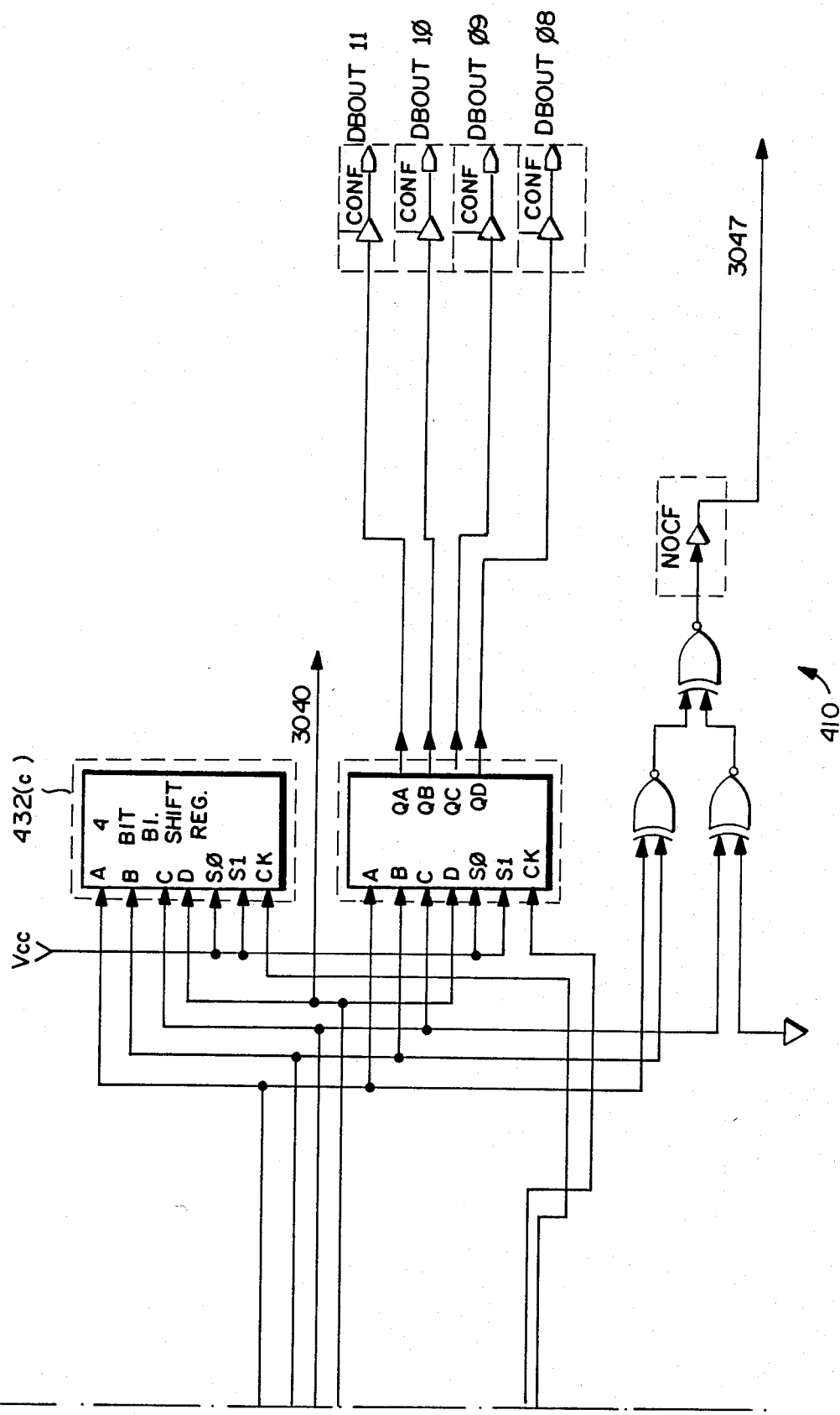

Whereas the "A" chip is the part of node 400 which controls synchronization, the "B" chip is responsible for generating interrupt requests to host 52. If the peripheral device attached to data connector 420 desires to initiate a bus cycle (e.g., the peripheral has data it must transmit to host 52 either on its own initiative or in response to a previous host request), the peripheral device asserts the UINTRPT line of data connector 420. This line is connected to an input of the "B" chip 410. Referring now to FIG. 5A–5C (a detailed schematic diagram of the "B" chip 410), the assertion of this UNITRPT line by the peripheral device sets a flip flop 434 which, in turn, causes a signal UNITRPTO outputted by the "B" chip 410 to rise. This UNITRPTO signal is applied to the input of timer 436 (see FIG. 3A) which times a time period of sufficient duration to ensure that the bus is inactive before the node applies an interrupt signal to the bus (and thus prevents a node generating an interrupt from interfering with communications occurring on active bus 350). The output of timer 436, in turn, is applied to the input of the "A" chip 406, which causes the "A" chip to apply an interrupt pulse to the CLKINOUT line (and thus, to pass this pulse along via data connector 414 to controller 100 via upstream nodes for sensing by controller PLA 110).

The "B" chip 410 also provides control for a diagnostic "bypass station" function provided in the preferred embodiment. In the preferred embodiment, central controller 52 is capable of diagnosing and isolating (and even recovering from) faults existing within one or more nodes 400 on databus 350. In particular, host 52 may transmit a special message packet having a bit sequence (e.g., in function code field 186) requesting the recipient node to bypass itself and thus remove itself from bus 350. The "B" chip senses whenever this bit pattern is present, and produces an BYPSTA signal which causes internal multiplexers within each of chips "A", "B", "C" and "D" 406–412 to simply bypass their respective internal shift registers and directly connect their respective serial inputs to their respective serial outputs. The "B" chip 410 also performs error checking and message validity checking (via a PLA chip 438) on the received message packet stored in equivalent output register 402 (a portion of the parity checking function is performed by gate arrays within "C" chip(s) 412), and disables (via the TLOUT control line) the "B" and "C" internal shift registers from applying invalid data they contain to the peripheral device parallel in data connector 418.

Figure 6A:
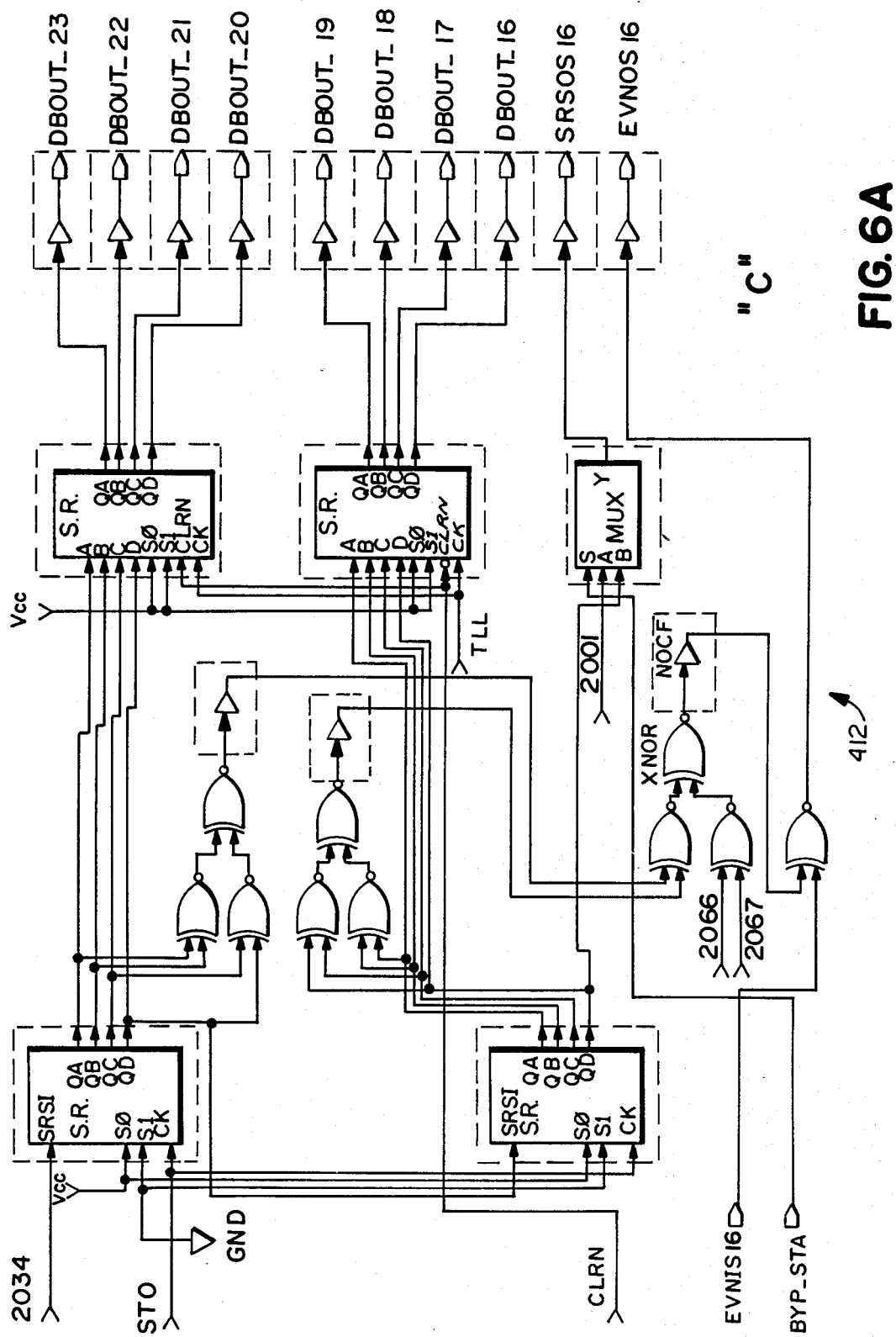
FIGS. 6A and 6B are together a detailed schematic diagram of integrated circuit "C" shown in FIG. 3C.
Figure 6B:
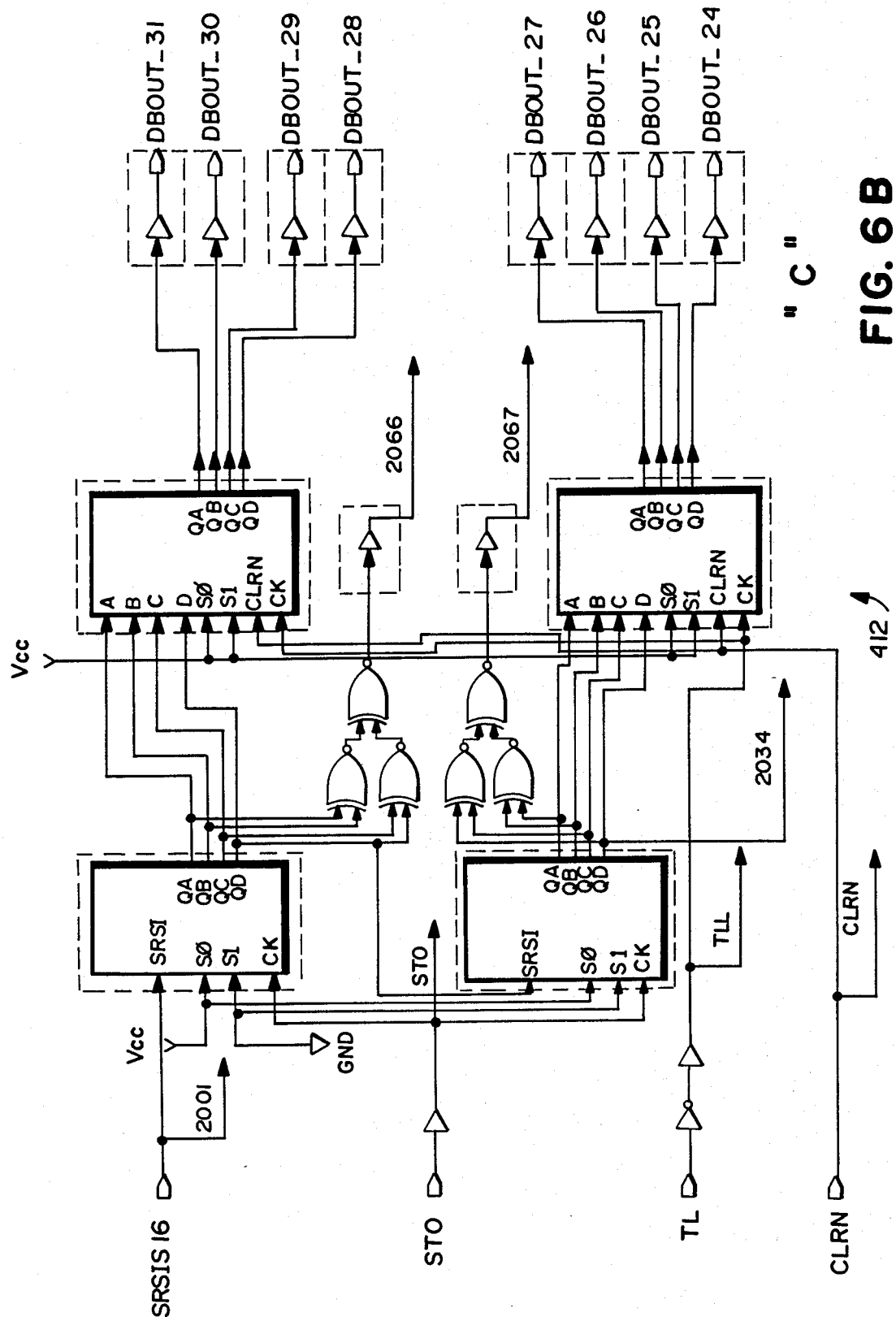

The "B" chip 410 provides appropriate control signals for controlling the mode and synchronization of the shift registers within the "C" chip 412 (which, as can be seen by referring to detailed schematic diagram FIGS. 6A and 6B, consists mostly of internal shift registers but also provides parity information to the "B" chip). A power-up reset circuit 440 is provided to clear shift registers within chips 406–412 and cause synchronous components to become reset to their initial states whenever power is first applied to the node.

DMA BUFFER CONTENTS

FIGS. 8A–8B are schematic diagrams of exemplary memory maps of the memory of DMA board 54 prior to and after a data transfer to bus 350. These memory maps reflect the three-node architecture shown in FIG. 2 (for sake of simplicity), and assume the following node configuration:

| NODE | OUTPUT REG. WIDTH | INPUT REG. WIDTH |
|------|-------------------|------------------|
| 400a | 32 bits | 16 bits |
| 400b | 32 bits | 32 bits |
| . | . | . |
| . | . | . |
| . | . | . |
| 400n | 16 bits | 48 bits |

Before a bus transfer, host 52 must write a identical image of the desired contents of the collective output shift register (made up of all of node output shift registers 402) into the DMA board 54 memory buffer, inserting meaningful data into those buffer words that will be transferred into the output shift register 402 of the specific node(s) 400 messages are intended for and writing invalid data (e.g., all zeros or some other "null" string) into the remaining words of the buffer.

FIG. 8A shows exemplary contents of a DMA buffer 54a (the portion of the memory of DMA board 54 used for communicating with bus 350) for transmitting a message packet to node 402b shown in FIG. 2. One null word is written into the first location of the DMA buffer to align subsequent messages. One null word is written into the word of DMA buffer 54a corresponding to the 16-bit wide output shift register 402n of last node 400n, a meaningful, correctly formatted message packet (two words long in this example) is written into the buffer at the position corresponding to output shift register 402b of node 400b intended to receive a message, and two null words are written into the buffer locations corresponding to output shift register 402a of first node 400a. Thus, words of buffer 54a are actually "mapped" into the output shift registers 402 of the nodes 400 when the buffer contents are transmitted over bus 350. In the preferred embodiment, host 52 determines the nature of this map by performing a self-configuration routine to be described shortly, and obtains from this process the offsets into buffer 54a corresponding to each individual node output shift register 402 along with the number of words (output packet length) associated with each node output shift register. The total number of bits in the mapped portion of the buffer is the number of outgoing clock pulses controller 100 must generate to ensure that the entire mapped buffer 54a is transferred to the distributed output shift register 402.

To transmit buffer 54a onto bus 350, controller 100 generates a load clock pulse followed by the total number of clock pulses required to transfer the buffer. Meanwhile, data from distributed input shift register 404 is flowing into controller 100 and is being written over the words of buffer 54a using "write-after-read" operations. The number of clock pulses required to read in the entire contents of distributed input register 402 is the same as the number of clock pulses required to transmit the contents of buffer 54a out to the distributed output shift register 402 because the lengths of the distributed input and output shift registers are compensated by inserting null words as required to make the length of the input 54b and output 54a DMA buffers equal in length.

When the total length of distributed output register 402 is greater than the total length of distributed input register 404, buffer 54a must contain sufficient words to fill the distributed output register. After a bus cycle is completed, the "top" of buffer 54a contains the input register 404 contents of nodes 400a–400n, followed by some additional words (the previous contents of the output registers 402 of one or more of the last nodes 400) that have "wrapped around" from the downstream portion of the output register through the input registers 404 and back to the controller 100. Host 52 ignores these additional words and examines only the part of the buffer 54a containing words read in from distributed input register 404.

When the total length of distributed output register 402 is less than the total length of distributed input register 404, buffer 54a must contain sufficient words to store the entire contents of the distributed input register. Before a bus cycle begins, host 52 must load the "top" of buffer 54a with sufficient null words so that, when controller 100 has sent out enough clock pulses to read the entire contents of the input register 404 into the buffer, the null words have "wrapped around" through loopback connection 405 and the useful input packets in the "bottom" of the buffer just fill the distributed input register 404.

When the data transmission operation is finished, buffer 54a contains an incoming message packet from each node 400 connected to bus 350 (the packet corresponding to the first node 400a is at the top of the buffer 54a). Host 52 may then examine certain words of the buffer 54a to determine the data transmitted by specific nodes 400, or examine the entire contents of the buffer to determine the data transmitted by all nodes. Because all nodes 400 transmit message packets for each activation of bus 350, it is sufficient for controller 100 to respond to an interrupt request pulse from a node 400 (this request does not specify the node requiring service in the preferred embodiment) by simply activating the bus 350 and transmitting a sufficient number of null packets onto the bus. In other words, interrupt requests from nodes are handled "anonymously" in the preferred embodiment by, in effect, polling the nodes 400 after an interrupt is received to determine which node originated the interrupt, without the interrupt request having to identify the node requesting the interrupt. While this reduces overhead transmitted over bus 350 and simplifies the design of nodes 400, it does require host 52 to examine the entire received contents of buffer 54a (e.g., to locate the received message packet with a function code field indicating the node originating it had generated the interrupt). This simplification of bus 350 by increasing the tasks to be performed by host 52 is consistent with the design goal of minimizing bus and node hardware requirements while taking advantage of the tremendous processing capabilities and speed of host 52.

Exemplary Program Control Steps

Figure 9:
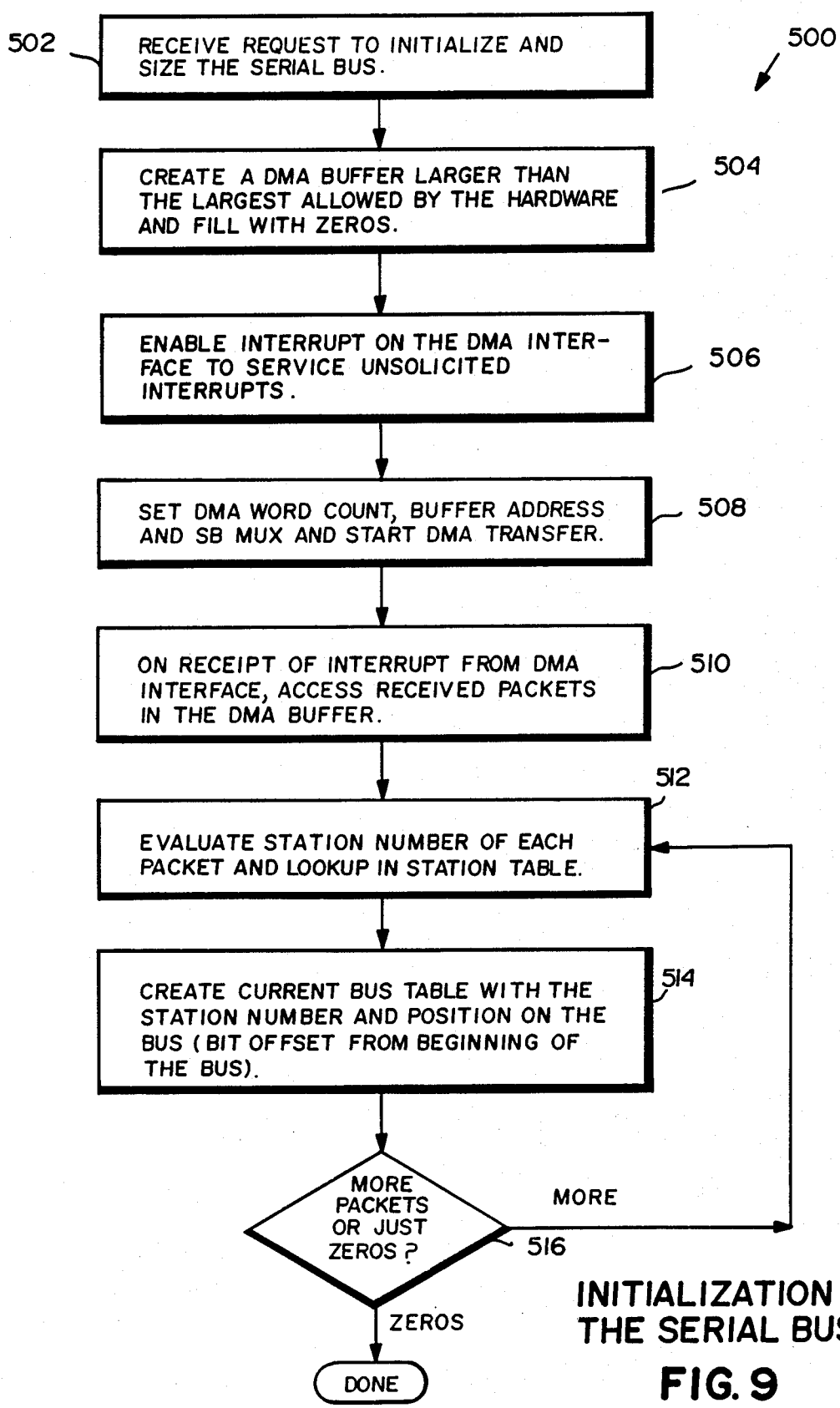
FIGS. 9, 10A and 10B are flow charts of exemplary program control steps performed by the host computer shown in FIG. 1 to interface with the serial data communications network.

FIG. 9 is a flowchart of exemplary program control steps of an initialization and self-configuration routine 500 performed by host 52 to initialize serial bus 350. In response to an application program request, routine 500 is called (block 502) and requested to initialize and size the serial bus 350. Host 52 then reserves in DMA board 54 memory a buffer 54a larger than the largest allowed size of the larger of distributed output register 402 and distributed input register 404 (block 504). Host 52 proceeds to write null words into this reserved buffer 54a (also block 504), and enables DMA board 54 to service unsolicited interrupts (block 506). Finally, host 52 initializes DMA board 54 for the data transfer (e.g., by setting DMA word count—that is, the length of buffer 54a to be transferred, the address of buffer 54a, and the address of the DMA board output port controller 100 is connected to) and starts the data transfer (block 508).

DMA board 54 then proceeds to transfer the entire (null) contents of buffer 54a to the output shift register 402 distributed over bus 350, and simultaneously reads in message packets from each and every node 400 on the bus (since all bus transfers are begun by issuing a load pulse from controller 100, all nodes load their respective input shift registers 404 with header and data information, and this information is sent back to controller 100 and DMA board 54). At the conclusion of the transfer, no node output register 402 contains valid data (they all contain null strings), so no associated peripheral devices receive any parallel data from their respective nodes as a result of the bus initialization steps. When the entire buffer 54a has been successfully transferred, DMA board 54 interrupts host 52 and permits the host to access buffer 54a (block 510).

Host 52 scans through the contents of buffer 54a and locates all headers 180 (block 512). Host 52 then uses a lookup table to determine the type of peripheral device associated with the identification number field 182 of each header 180 it finds (block 512), and obtains the associated input and output packet lengths from a lookup table the host maintains, this lookup table specifying the input and output packet lengths for each different type of node (peripheral). Host 52 creates a current bus table in its own memory, this table listing station number and bus position (bit offset from the first word in buffer 54a), from this type and length information (block 514). Host 52 continues performing the steps of blocks 512, 514 until the host "runs out" of received message packets and encounters null strings (these are the same null strings sent out by block 504 after propagating around bus 350, since more null strings are transmitted by routine 500 than can "fit" in distributed output register 402). Host 52 then determines the size of buffer 54a as the longer of the distributed output register 402 and the distributed input register 404—based on the entries now stored in the current bus table.

Figure 10A:
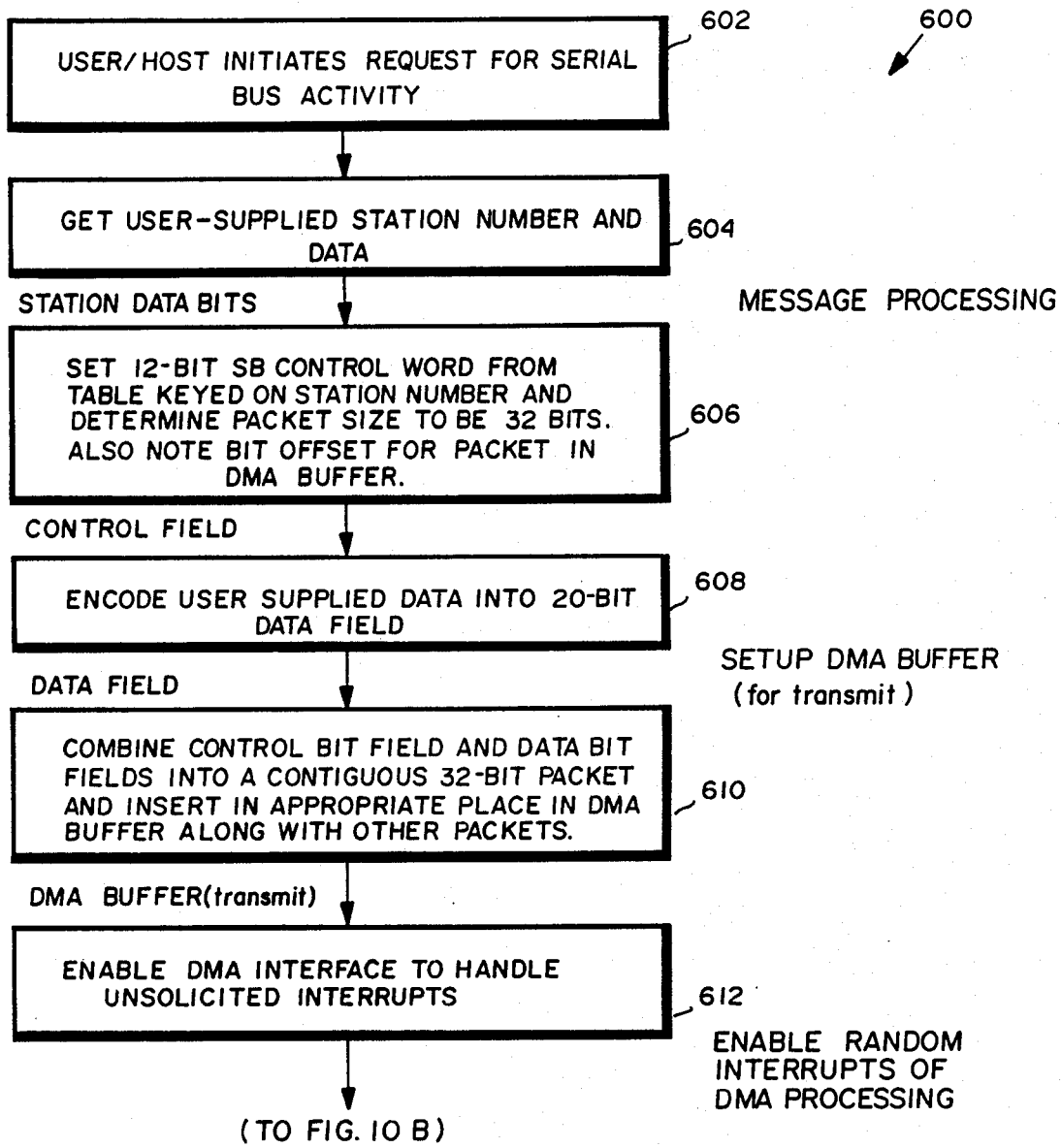
Figure 10B:
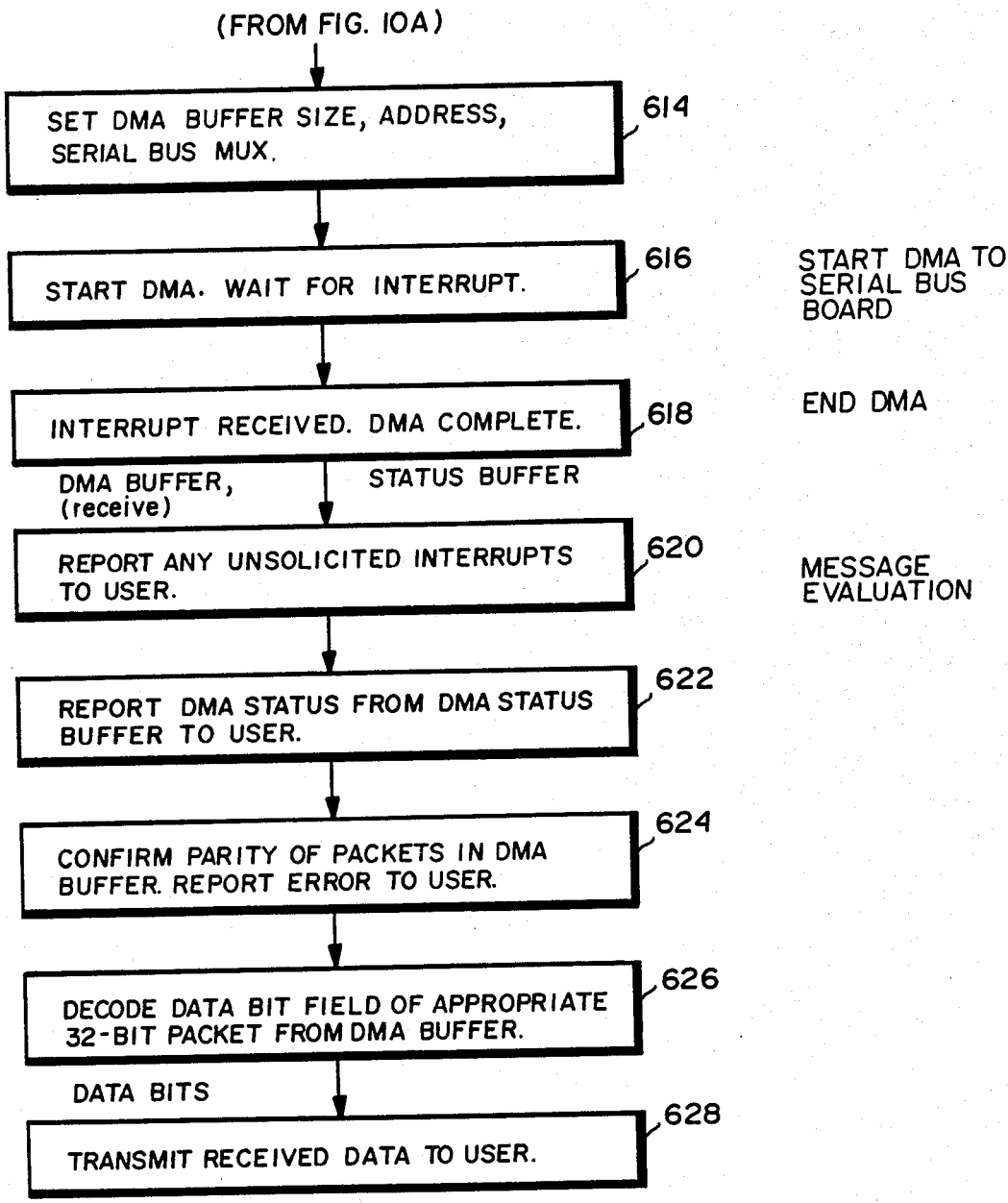

FIGURES 10A and 10B are together a flowchart of exemplary program control steps included in a transmit/receive routine 600 performed by host 52 to transmit a message packet to a specific node 400 (e.g., node 400b) on bus 350 and/or to receive messages from (all) bus nodes.

When an application program requests a bus cycle (block 602), routine 600 first obtains the application program supplied station (node) number and the data to be transmitted to the node (in the case of a request to transmit to a specific node) (block 604). Routine 600 uses the current bus table constructed by routine 500 block 514 to determine the packet length and offset into DMA buffer 54a corresponding to the node to be sent a message (block 606). Host 52 then encodes the user-supplied data into a 20-bit (or other appropriate length) data field (block 608), adds appropriate header portion 180 to the beginning of the data (block 610), and inserts the newly formed message packet into the appropriate offset position of DMA buffer 54a (after ensuring that all other words in the DMA buffer contain null strings (also block 610). If routine 600 is called because of an interrupt generated by a bus node 400, the steps of blocks 604-610 are skipped, and host 52 simply ensures that buffer 54a contains null strings. In either case, host 52 enables the DMA board 54 to handle unsolicited interrupts (block 612), initializes the DMA board to transfer the entire buffer 54a onto serial bus 350 (block 614), and begins the DMA transfer (block 616).

After DMA board 54 has completed transferring the entire contents of buffer 54a into the distributed serial data output register 402 existing on bus 350 (and has read in the entire distributed serial data input register 404 into the buffer 54a), the DMA board interrupts the host (block 618). If controller 100 detects any "glitches" in the transfer (e.g., one or more clock pulses failed to loop back), an error is reported to the application program (e.g., by way of a return code) (block 620). Host 52 also reports the DMA status to the application program (block 622), confirms that the appropriate packet or packets were received correctly via parity checking (block 624), decodes the data contained in one or more received packets of interest (block 626), and transmits the decoded data to the user (block 628).

While the invention has been described in connection with what is presently considered to be the most practical and preferred embodiment, it is to be understood that the invention is not to be limited to the disclosed embodiment, but on the contrary, is intended to cover various modifications and equivalent arrangements in-

What is claimed is:

1. A nuclear magnetic resonance imaging system comprising:
   RF and magnetic coil means for exciting a body to be imaged;
   means for sensing the nuclear magnetic resonance response from said excited body;
   data acquisition computer means, connected to said sensing means, for developing an image of said body in response to said sensed nuclear magnetic resonance response;
   peripheral means, operatively coupled to said coil means and/or said sensing means, for affecting the operation thereof;
   control computer means for controlling said peripheral means; and
   digital communications means for communicating digital signals between said peripheral means and said control computer means, said communications means including:
   a controller including a first input shift register and a first output shift register, said peripheral means including a further input shift register and a further output shift register,
   communications link means connected between said controller and said peripheral means for connecting said first and further input shift registers together in series to provide an input shift register distributed between said controller and said peripheral means, and for connecting said first and further output shift registers together in series to provide an output shift register distributed between said controller and said peripheral means, and
   clock loop means for applying shift pulses to said distributed input shift register causing data to flow from said further to said first input shift register and for applying said same shift pulses to said distributed output shift register causing data to flow from said first to said further output shift register.

2. A digital communications network for exchanging digital signal messages between plural digital devices within a magnetic resonance imaging system, said digital communications network comprising:
   plural discrete shift register means respectively corresponding to said plural digital devices, connected together in series, and connected to said plural digital devices, each for: (a) serially storing data applied to a serial input thereof, (b) serially shifting stored data in a first propagation direction to the input of another of said discrete shift register means in response to receipt of a clocking signal, and (c) providing said stored data to a digital device associated and corresponding therewith; and
   clocking signal communicating means operatively coupled to said series-connected plural shift registers for propagating a common clocking signal in sequence to said plural discrete shift register means in a second propagation direction opposite said first propagation direction.

3. A network as in claim 2 wherein said plural discrete shift register means store different length strings of serial data.

4. A network as in claim 2 wherein said magnetic resonance imaging system includes imaging means for acquiring an image, and said clocking signal communicating means includes means for inhibiting propagation of said common clocking signal while said imaging means is acquiring an image.

5. A network as in claim 2 wherein each of said discrete shift register means includes means for storing digital header signals specifying the length of said shift register means and an identification of the digital device corresponding to said shift register means.

6. A network as in claim 2 further including plural discrete interrupt generating means connected to said plural digital devices, each of said interrupt generating means coupled to said clocking signal communicating means, said interrupt generating means for selectively applying an interrupt request signal to said clocking signal communicating means, said clocking signal communicating means propagating said clocking signal in response to said interrupt request signal.

7. A network as in claim 2 further including communications link means for connecting said plural discrete shift register means together in series, said communications link means including fiber optical cables and twisted pair cables.

8. A network as in claim 2 wherein:
   said clocking signal communicating means includes:
   means for generating a train of clocking signal pulses, and
   clock loop means for providing a signal propagation path originating at said clocking signal generating means, propagating to each of said plural discrete shift register means, and terminating at said clocking signal generating means; and
   said clocking signal generating means includes means for applying a clocking signal pulse to said clock loop means, means for sensing whether said applied pulse has propagated over said clock loop means and back to said clocking signal generating means, and means connected to said sensing means for inhibiting generation of the next clocking signal pulse in said train until said sensing means senses receipt of said propagated applied pulse.

9. A digital communications network for exchanging digital signal messages between plural digital devices within a magnetic resonance imaging system, said digital communications network including:
   plural discrete input shift register means distributed among said plural digital devices each for (a) storing data serially applied to a serial input terminal thereof, (b) serially shifting said stored data to an output terminal thereof, and (c) providing said stored data to a digital device associated therewith;
   plural discrete input shift register means distributed among said plural digital devices each for: (a) storing data serially applied to a serial input thereof, (b) serially shifting said stored data to an output terminal thereof, and (c) loading said stored data from the digital device associated therewith;
   output communications link means connected to said plural discrete output shift register means input and output terminals for connecting said plural discrete output shift register means together in series;
   input communications link means connected to said plural discrete input shift register means input and output terminals for connecting said plural discrete input shift register means together in series; and
   loopback means for connecting said serially connected plural discrete output shift register means in series with said serially connected plural discrete input shift register means.

10. A digital communications network node chip set for exchanging digital signal messages between a peripheral device and a central computer within a magnetic resonance imaging system, said chip set comprising:
- first chip means (B) having a serial input terminal and a serial output terminal for: (a) serially storing data applied to said serial input terminal, (b) serially shifting stored data to said serial output terminal, and (c) providing stored parallel format data to said peripheral device;
- optional second chip means (C) having a serial input terminal and a serial output terminal for: (a) serially storing data applied to said serial input terminal, (b) serially shifting stored data to said serial output terminal, and (c) providing stored further parallel format data to said peripheral device;
- third chip means (A) having a serial input terminal and a serial output terminal for: (a) serially storing data applied to said serial input terminal, (b) serially shifting stored data to said serial output terminal, and (c) loading and storing parallel format data provided by said peripheral device;
- optional fourth chip means (D) having a serial input terminal and a serial output terminal for: (a) serially storing data applied to said serial input terminal, (b) serially shifting stored data to said serial output terminal, and (c) loading and storing further parallel format data provided by said peripheral device;
- means for connecting said first chip means input and output terminals in series with said optional second chip means input and output terminals if said second chip means is used; and
- means for connecting said third chip means input and output terminals in series with said optional fourth chip means input and output terminals if said fourth chip means is used.

11. A chip set as in claim 10 including a different number of said optional second chip means than said optional fourth chip means.

12. A chip set as in claim 10 wherein:
- said second chip means provides a certain number of parallel data bits to said peripheral device; and
- said fourth chip means loads and stores said same certain number of parallel data bits applied thereto by said peripheral device.

13. A chip set as in claim 10 wherein said first chip means includes means for analyzing certain data bits stored therein for validity and means for inhibiting applying said stored parallel bits to said peripheral device in response to said analysis.

14. A bidirectional digital communication network for communicating digital signal messages between a central computer of a magnetic resonance imaging system and each of a plurality of peripheral devices, said network comprising:
- output shift register means distributed among said plural peripheral devices for communicating data from said central computer to said peripheral devices, said output shift register means including a plurality of serially-connected discrete output shift registers associated with and corresponding to said plurality of peripheral devices, respectively;
- input shift register means distributed among said plural peripheral devices for communicating data from said peripheral devices to said central computer, said input shift register means including a plurality of serially-connected discrete input shift registers associated with and corresponding to said plurality of peripheral devices, respectively; and
- controller means connected to receive data generated by said central computer and to supply data to said central computer for (a) selecting at least one peripheral device, (b) loading central computer generated data serially into said output shift register means, (c) shifting said loaded data into the specific discrete output shift register associated with and corresponding to said selected peripheral device, and (d) serially reading data from said input shift register means and supplying said read data to said central computer.

15. A network as in claim 14 wherein:
- said controller means includes means for generating a train of clocking signals and for sequentially applying said clocking signals to said plurality of serially-connected discrete output shift registers and to said plurality of serially-connected discrete input shift registers;
- each of said plurality of serially-connected discrete output shift registers and each of said plurality of serially-connected discrete input shift registers includes means for shifting data in response to said applied clocking signals; and
- said controller means further includes means for determining the number of clocking signals in said clocking signal train required to read data from all of said input shift registers and to shift data into all of said output shift register means.

16. A network as in claim 14 wherein said controller means includes means for generating a clocking signal and for propagating said clocking signal along said output shift register means and said input shift register means in a direction opposite the direction said loaded data is shifted into said output shift register means.

17. A network as in claim 14 wherein said controller means includes:
- buffer means for storing said central computer generated data, said buffer means including a plurality of storage locations corresponding to said plurality of discrete output shift registers;
- means connected to said buffer means for depositing said central computer generated data into the buffer means storage location(s) corresponding to the discrete output shift register associated with and corresponding to said selected peripheral device; and
- means connected to said buffer means for serially transferring the contents of each of said plurality of storage locations to said output shift register means.

18. A network as in claim 14 wherein:
- said output shift register means is also for temporarily storing a digital data string of a first length;
- said input shift register means is also for temporarily storing a digital data string of a second length different from said first length;
- said network further includes loopback means for connecting said output shift register means and said input shift register means in series; and
- said controller means includes means for sequentially shifting a first data string having said first length into said output shift register means and for simultaneously shifting a second data string having said second length out of said input shift register means.

* * * * *

UNITED STATES PATENT AND TRADEMARK OFFICE
CERTIFICATE OF CORRECTION

PATENT NO. : 4,885,538

DATED : 5 December 1989

INVENTOR(S) : HOENNINGER et al

It is certified that error appears in the above-identified patent and that said Letters Patent is hereby corrected as shown below:

On the cover page, under item [19], "Hoenniger" should be --Hoenninger--.

On the cover page [75] - Inventors:

First inventor's name should read --John C. Hoenninger, III--.

Signed and Sealed this

Nineteenth Day of February, 1991

*Attest:*

HARRY F. MANBECK, JR.

*Attesting Officer*     *Commissioner of Patents and Trademarks*